(12) United States Patent
Hashiba et al.

(10) Patent No.: US 9,093,196 B2
(45) Date of Patent: Jul. 28, 2015

(54) CONDUCTIVE PARTICLES AND METHOD OF PREPARING THE SAME

(75) Inventors: Toshifumi Hashiba, Chiba (JP); Kazutoshi Hayakawa, Chiba (JP); Satomi Kudo, Chiba (JP); Kohei Moriyama, Chiba (JP); Tsuyoshi Fujii, Nagareyama (JP)

(73) Assignee: NISSHINBO HOLDINGS, INC., Tokyo (JP)

( * ) Notice: Subject to any disclaimer, the term of this patent is extended or adjusted under 35 U.S.C. 154(b) by 927 days.

(21) Appl. No.: 11/863,379

(22) Filed: Sep. 28, 2007

(65) Prior Publication Data

US 2008/0078977 A1 Apr. 3, 2008

(30) Foreign Application Priority Data

Sep. 29, 2006 (JP) ................................. 2006-269028

(51) Int. Cl.
| | | |
|---|---|---|
| H01B 1/00 | (2006.01) | |
| H01B 1/20 | (2006.01) | |
| C08J 3/12 | (2006.01) | |
| H01B 1/12 | (2006.01) | |
| H05K 3/32 | (2006.01) | |

(52) U.S. Cl.
CPC ... *H01B 1/20* (2013.01); *C08J 3/12* (2013.01); *C08J 3/126* (2013.01); *H01B 1/128* (2013.01); *H05K 3/321* (2013.01); *C08J 2333/20* (2013.01); *H05K 3/323* (2013.01); *H05K 2201/0221* (2013.01); *H05K 2201/0233* (2013.01); *Y10T 428/2998* (2015.01)

(58) Field of Classification Search
CPC ......... C08F 2/44; C08F 292/00; G03G 9/135; B32B 27/06; B32B 37/06; H01B 3/44; H01B 7/17; H01B 7/292
USPC .......... 252/500; 428/407, 703, 402, 232, 328; 349/155
See application file for complete search history.

(56) References Cited

U.S. PATENT DOCUMENTS

| | | | | |
|---|---|---|---|---|
| 5,063,128 | A | * | 11/1991 | Yuh et al. ........................ 430/63 |
| 6,187,440 | B1 | * | 2/2001 | Wu ............................... 428/407 |
| 7,566,494 | B2 | * | 7/2009 | Jun et al. ....................... 428/323 |
| 2005/0288469 | A1 | * | 12/2005 | Higuchi et al. ................. 526/319 |

FOREIGN PATENT DOCUMENTS

| | | | | |
|---|---|---|---|---|
| JP | 62-185749 | A | | 8/1987 |
| JP | 01-144429 | A | | 6/1989 |
| JP | 1-225776 | A | | 9/1989 |
| JP | 05-017736 | A | | 1/1993 |
| JP | 5-19241 | B | | 3/1993 |
| JP | 7-95165 | B | | 10/1995 |
| JP | 8-193186 | A | | 7/1996 |
| JP | 2000-309715 | A | | 11/2000 |
| JP | 2000-315425 | | * | 11/2000 |
| JP | 2000-315425 | A | | 11/2000 |
| JP | 2001-216840 | A | | 8/2001 |
| JP | 2001-216841 | A | | 8/2001 |
| JP | 2003-045230 | A | | 2/2003 |
| JP | 2003-208813 | A | | 7/2003 |
| JP | 2003-2008813 | | * | 7/2003 |
| JP | 2003-313304 | | * | 11/2003 |
| JP | 2003-313304 | A | | 11/2003 |
| JP | 2005-327510 | A | | 11/2005 |
| WO | WO 92/06402 | | * | 4/1992 .................. 9/35 |
| WO | WO 92/06402 | A1 | | 4/1992 |

OTHER PUBLICATIONS

Li, K. et al.; Synthesis of Monodisperse Poly (divinylbenzene) Microspheres; Journal of Polymer Science, Part A; Polymer Chemistry USA, 1993, vol. 31 pp. 3257-3263.

* cited by examiner

*Primary Examiner* — Monique Peets
(74) *Attorney, Agent, or Firm* — Westerman, Hattori, Daniels & Adrian, LLP

(57) ABSTRACT

Conductive particles each includes a polymer base particle and a conductive layer coating the polymer base particle. Let the compressive elastic deformation characteristic $K_X$ of one conductive particle when the displacement of particle diameter of the conductive particles is X % be defined by the following formula: $K_X=(3/\sqrt{2})\cdot(S_X^{-3/2})\cdot(R^{-1/2})\cdot F_X$. $F_X$ is the load (N) necessary for X % displacement of the conductive particles. $S_X$ is the compressive deformation amount (mm) upon X % displacement of the conductive particles. R is the particle radius (mm) of the conductive particles. The compressive elastic deformation characteristic $K_{50}$ when the displacement of particle diameter of the conductive particles is 50% is 100 to 50000 N/mm² at 20° C., and the recovery factor of particle diameter of the conductive particles when the displacement of particle diameter of the conductive particles is 50% is not less than 30% at 20° C.

14 Claims, 7 Drawing Sheets

LOADING-UNLOADING TEST (COMPRESSION DISPLACEMENT 50%)

LOADING-UNLOADING TEST (COMPRESSION DISPLACEMENT 55%)

LOADING-UNLOADING TEST (COMPRESSION DISPLACEMENT 60%)

LOADING-UNLOADING TEST (COMPRESSION DISPLACEMENT 65%)

LOADING-UNLOADING TEST (COMPRESSIVE LOAD 9.8mN)

LOADING-UNLOADING TEST (COMPRESSIVE LOAD 14.7mN)

LOADING-UNLOADING TEST (COMPRESSIVE LOAD 17.64mN)

CONDUCTIVE PARTICLES AND METHOD OF PREPARING THE SAME

CROSS-REFERENCE TO RELATED APPLICATION

This non-provisional application claims priority under 35 U.S.C. §119(a) on Patent Application No. 2006-269028 filed in Japan on Sep. 29, 2006, the entire contents of which are hereby incorporated by reference.

BACKGROUND OF THE INVENTION

1. Field of the Invention

The present invention relates to conductive particles and a method of preparing the same.

2. Description of the Related Art

In recent years, in the fields of electric and electronics materials, conductive particles have been applied to conductive materials such as liquid-crystal spacers, micro-device mounting conductive adhesives, anisotropic conductive adhesives, conductive connecting structures, etc. and put to practical use.

The conductive particles for use in such conductive materials are required to show excellent properties with regard to connection resistance and connection reliability. In the conductive particles, therefore, not only the control of particle diameter of the polymer particles serving as base particles but also the control of hardness and elastic characteristics of the particles, deformation recovery factor after compression displacement, etc. will be of importance.

Examples of the conductive particles thereto known include the following.

For example, JP-A 62-185749 and JP-A 1-225776 disclose conductive microspheres using polyphenylene sulfide particles, phenol resin particles or the like as base microspheres.

Such conductive microspheres using synthetic resin particles as base microspheres are poor in deformation recovery performance after compressive deformation. Therefore, when a compressive load exerted on electrodes in the process of connecting the electrodes to each other by use of the conductive microspheres is removed, slight gap would be formed at the interface between the conductive microsphere and the electrode surface, resulting in contact failure.

JP-B 5-19241 discloses conductive particles in which particles of a soft low-density cross-linked material composed mainly of styrene are used as base particles and their surfaces are coated with a conductive material.

However, such conductive particles having a soft base material also have a low deformation recovery factor of 10% or below after compressive deformation, and the restoring force is lowered with the lapse of time. Therefore, in the case where the conductive particles having the soft base material are used for connection between electrode, also, the connection resistance would increase with the lapse of time, leading to poor connection reliability.

JP-B 7-95165 and JP-A 2000-309715 disclose conductive particles obtained by use of base particles of which the compressive elastic modulus and compressive deformation recovery factor upon 10% displacement of particle diameter are controlled to predetermined values. In addition, JP-A 2003-313304 discloses conductive particles which are composed of a polymer obtained by using a divinylbenzene-ethylvinylbenzene mixture as part of the starting monomers and of which the compressive elastic modulus, compressive deformation recovery factor and breaking strain upon 10% displacement of particle diameter are controlled to predetermined values.

However, most of these conductive particles show a substantial breaking point at a compression displacement of less than 45%, and it is difficult with these conductive particles to enhance the deformation recovery factor upon a high compression displacement. Moreover, the base particles are susceptible to erosion by a strongly acidic or strongly alkaline medium in a plating step, which is a step for forming a conductive film on the base particles. As a result, in most cases, the physical properties intrinsic of the polymer particles would be lowered, and the exfoliation or cracking of the plating film would adversely affect the compressive elasticity characteristics of the base particles constituting the core parts of the conductive particles, resulting in a large lowering in physical properties such as hardness.

Meanwhile, technologies for forming a coat layer on the surfaces of resin particles so as to enhance the adhesion between the resin particles and a conductive material layer thereon are disclosed in JP-A 8-193186 and JP-A 2003-208813.

More specifically, JP-A 8-193186 discloses conductive particles for an anisotropic conductive adhesive in which insulating particles each composed of an inner core and an outer layer coating the inner core and softer than the inner core are further coated with a conductive material, whereas JP-A 2003-208813 discloses conductive particles in which resin particulates each composed of a core particulate and a resin coat layer formed on the surface of the core particulate are coated with a metallic coat layer.

However, in both the conductive particles disclosed in JP-A 8-193186 and JP-A 2003-208813, the core particles (polymer particles) are intrinsically poor in high compression displacement property, so that the high compression displacement amount and deformation recovery factor of the conductive particulates obtained are not so effectively improved; as a result, it is difficult to improve the connection resistance property and the connection reliability. In addition, when the outer layer is made thicker, the physical properties of the soft base material would play a greater role, like in the case of JP-B 5-19241, which adversely affects the physical properties indispensable to conductive particles, such as heat resistance and solvent resistance. Moreover, since the deformation recovery factor upon a high compression displacement is poor, the coating of the core particles with the outer layer is insufficient in the effect of enhancing the adhesion between the core particle and the conductive material layer.

Thus, there have not been known any conductive particles such that compressive deformation characteristics are not considerably lowered even upon formation of a conductive layer, and good deformation recovery performance after a high compression displacement is secured, so that the area of adhesion between the particles and an electrode surface can be enhanced.

SUMMARY OF THE INVENTION

An object of the invention is to provide conductive particles excellent in deformation recovery factor after compressive deformation, particularly in deformation recovery factor upon a high compression displacement, and a method of preparing the same.

Another object of the invention is to provide conductive particles such that the lowering in physical properties of a polymer constituting the core of the particles due to contact with a strong acid or strong alkali used in a plating step is restrained, and a method of preparing the same.

As a result of intensive and extensive investigations for attaining the above need, the present inventors have found out that conductive particles each include a polymer base particle and a conductive layer coating the polymer base particle, wherein let the compressive elastic deformation characteristic $K_X$ of one conductive particle when the displacement of particle diameter of the conductive particles is X % be defined by the following formula [1]:

$$K_X = (3/\sqrt{2}) \cdot (S_X^{-3/2}) \cdot (R^{-1/2}) \cdot F_X \quad [1]$$

where $F_X$ is the load (N) necessary for X % displacement of the conductive particles, $S_X$ is the compressive deformation amount (mm) upon X % displacement of the conductive particles, and R is the particle radius (mm) of the conductive particles, then the compressive elastic deformation characteristic $K_{50}$ when the displacement of particle diameter of the conductive particles is 50% is 100 to 50000 N/mm² at 20° C., and the recovery factor of particle diameter of the conductive particles when the displacement of particle diameter of the conductive particles is 50% is not less than 30% at 20° C., are particles in which the soft and highly elastic characteristics of the base particles are maintained sufficiently and which are free of the above-mentioned problems encountered in the related art. Based on the finding, the present invention has been completed.

Accordingly, the present invention provides the following 1 to 17:

1. Conductive particles each including a polymer base particle and a conductive layer coating the polymer base particle, wherein let the compressive elastic deformation characteristic $K_X$ of one conductive particle when the displacement of particle diameter of the conductive particles is X % be defined by the following formula [1]:

$$K_X = (3/\sqrt{2}) \cdot (S_X^{-3/2}) \cdot (R^{-1/2}) \cdot F_X \quad [1]$$

where $F_X$ is the load (N) necessary for X % displacement of the conductive particles, $S_X$ is the compressive deformation amount (mm) upon X % displacement of the conductive particles, and R is the particle radius (mm) of the conductive particles, then the compressive elastic deformation characteristic $K_{50}$ when the displacement of particle diameter of the conductive particles is 50% is 100 to 50000 N/mm² at 20° C., and the recovery factor of particle diameter of the conductive particles when the displacement of particle diameter of the conductive particles is 50% is not less than 30% at 20° C.;

2. Conductive particles as set forth in 1 above, wherein in a compression displacement range of not more than 55%, there is no breaking point or no point of inflection where the compressive deformation factor increases abruptly;

3. Conductive particles as set forth in 1 above, wherein in a graph showing the relationship between compressive elastic deformation characteristic $K_X$ of the conductive particles and compression displacement at 20° C., with the compressive elastic deformation characteristic $K_X$ taken on the axis of ordinates and with the compression displacement taken on the axis of abscissa, in the case where the point of compressive elastic deformation characteristic $K_{10}$ upon 10% displacement of particle diameter of the conductive particles is taken as a reference point, a straight line passing through the reference point and being orthogonal to the axis of ordinates is drawn, and the other intersection of the straight line with the graph than the reference point is made to be $K_P$ point, the compression displacement at the $K_P$ point is not less than 40%;

4. Conductive particles as set forth in 1 above, wherein the polymer base particles each include a core particle and a polymer coat layer formed on the surface of the core particle;

5. Conductive particles as set forth in 1 above, wherein let the compressive elastic deformation characteristic $K_{BX}$ of one polymer base particle when the displacement of particle diameter of the polymer base particles is X % be defined by the following formula [2]:

$$K_{BX} = (3/\sqrt{2}) \cdot (S_{BX}^{-3/2}) \cdot (R_B^{-1/2}) \cdot F_{BX} \quad [2]$$

where $F_{BX}$ is the load (N) necessary for X % displacement of the polymer base particles, $S_{BX}$ is the compressive deformation amount (mm) upon X % displacement of the polymer base particles, and $R_B$ is the particle radius (mm) of the polymer base particles, then the compressive elastic deformation characteristic $K_{B60}$ when the displacement of particle diameter of the polymer base particles is 60% is 100 to 50000 N/mm² at 20° C., and the recovery factor of particle diameter of the polymer base particles when the displacement of particle diameter of the polymer base particles is 60% is not less than 20% at 20° C.;

6. Conductive particles as set forth in 4 above, wherein the compressive elastic deformation characteristic $K_{C10}$ of one particle upon 10% displacement of particle diameter of the core particles and the compressive elastic deformation characteristic $K_{B10}$ of one particle upon 10% displacement of particle diameter of the polymer base particles satisfies the following expression [3]:

$$K_{C10} > K_{B10} \quad [3];$$

7. Conductive particles as set forth in 4 above, wherein the polymer coat layer is made of a hydrophobic resin;

8. Conductive particles as set forth in 7 above, wherein the hydrophobic resin is a styrene resin;

9. Conductive particles as set forth in 4 above, wherein the core particles are obtained by using a monomer having at least two unsaturated double bonds in its molecule, in an amount of not less than 35 wt %;

10. Conductive particles as set forth in 9 above, wherein the monomer having at least two unsaturated double bonds is one or more selected from divinylbenzene and polyfunctional (meth)acrylate monomers;

11. Conductive particles as set forth in 10 above, wherein the polyfunctional (meth)acrylic ester monomer includes at least one selected from di(meth)acrylate monomers;

12. Conductive particles as set forth in 9 above, wherein the core particles are obtained by further using an unsaturated monomer having a hydrophilic functional group or active hydrogen group in its molecule, in an amount of not less than 3 wt %, in addition to the monomer having at least two unsaturated double bonds in its molecule;

13. Conductive particles as set forth in 12 above, wherein the unsaturated monomer having the hydrophilic functional group or active hydrogen group is a monomer having at least one functional group selected from among hydroxyl group, carboxyl group, amino group, amide group and alkylene oxide groups;

14. Conductive particles as set forth in 9 above, wherein the core particles are prepared by solution polymerization of a starting monomer containing not less than 35 wt % of a monomer which has at least two unsaturated double bonds in the molecule thereof and which includes at least one selected from polyfunctional (meth)acrylate monomers, in a medium which dissolves the starting monomer but does not dissolve the particles produced;

15. A method of preparing conductive particles, including the steps of subjecting a starting monomer containing not less than 35 wt % of a monomer which has at least two unsaturated double bonds in the molecule thereof and which includes at least one selected from polyfunctional (meth)acrylate monomers to solution polymerization in a medium which dissolves the starting monomer but does not dissolve the particles produced, so as to prepare core particles, forming a polymer coat layer on the surface of each of the core particles, so as to prepare polymer base particles, and forming a conductive layer on the surface of each of the polymer base particles;

16. A resin composition including conductive particles as set forth in 1 above, and a resin; and 17. A conductive adhesive including conductive particles as set forth in 1 above, and an adhesive resin.

In the conductive particles according to an embodiment of the present invention, the compressive elastic deformation characteristic $K_{50}$ when the displacement of particle diameter is 50% is 100 to 50000 N/mm² (as measured at 20° C.) and the recovery factor of particle diameter upon 50% displacement of particle diameter is not less than 30% (as measured at 20° C.). Thus, the conductive particles of an embodiment of the present invention remain flexible with good compressive deformation recovery factor even upon a compression displacement of not less than 50%, notwithstanding the high compressive elasticity characteristics thereof. Therefore, the conductive particles can be lowered in electrical resistance, and can be suitably used as a base material for conductive materials in the fields of electric and electronics materials.

In addition, the polymer base particles constituting the conductive particles according to an embodiment of the present invention each include a core particle and a polymer coat layer formed on the surface of the core particle. This configuration makes it possible, for example, to prevent the core particles from being eroded with a strongly acidic or strongly alkaline medium used in a plating treatment, so that physical properties of the polymer base particles can be restrained from being lowered upon the plating treatment.

Furthermore, the conductive particles according to an embodiment of the present invention have appropriate levels of hardness and elasticity. Therefore, the conductive particles of an embodiment of the present invention suffer neither from the troubles due to contact failure, marring or cracking generated in the case of using too hard polymer particles nor from the troubles due to a lowering in compressive deformation recovery factor observed in the case of using too soft polymer particles.

The conductive particles according to an embodiment of the present invention are especially excellent in regard of connection resistance property and connection reliability; therefore, the conductive particles can be suitably used as a conductive material in micro-device mounting conductive adhesives, anisotropic conductive adhesives, conductive connecting structures, etc.

DETAILED DESCRIPTION OF THE PREFERRED EMBODIMENT

Figure 1:
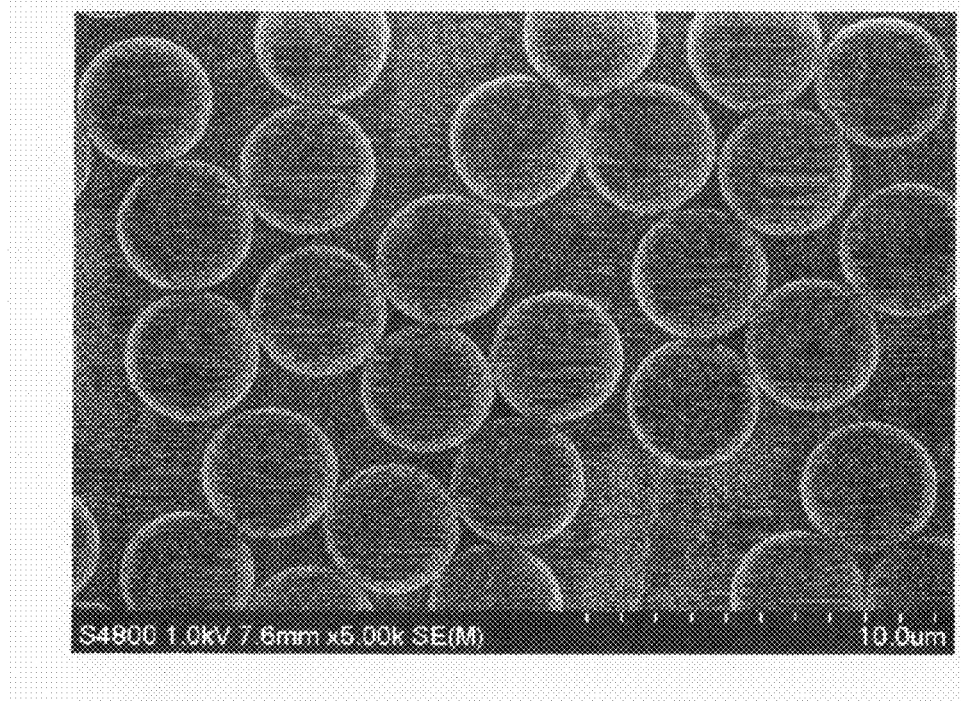
FIG. 1 is an SEM photograph of polymer base particles 1.

Now, an embodiment will be described more in detail below.

The conductive particles according to an embodiment of the present invention each have a polymer base particle and a conductive layer coating the polymer base particle, wherein let the compressive elastic deformation characteristic $K_X$ of one conductive particle when the displacement of particle diameter of the conductive particles is X % be defined by the following formula [1]:

$$K_X = (3/\sqrt{2}) \cdot (S_X^{-3/2}) \cdot (R^{-1/2}) \cdot F_X \quad [1]$$

where $F_X$ is the load (N) necessary for X % displacement of the conductive particles, $S_X$ is the compressive deformation amount (mm) upon X % displacement of the conductive particles, and R is the particle radius (mm) of the conductive particles, then the compressive elastic deformation characteristic $K_{50}$ when the displacement of particle diameter of the conductive particles is 50% is 100 to 50000 N/mm² at 20° C., and the recovery factor of particle diameter of the conductive particles when the displacement of particle diameter of the conductive particles is 50% is not less than 30% at 20° C.

In the present invention, the compressive elastic deformation characteristic $K_X$ upon X % displacement of the particle diameter (hereinafter sometimes referred to as X % K value) is the value obtained from the following formula after measurement of load, compression displacement and the like when the particles obtained are compressed at a compression rate of 0.225 g/second by a smooth end face of a diamond-made cylinder with a diameter of 50 μm using a micro-compression testing machine (MCT-W201, produced by Shimadzu Corporation). Specifically, for obtaining a 50% K value, the load necessary for 50% displacement of the particles and the compressive deformation amount are measured, and for obtaining a 60% K value, the load necessary for 60% displacement of the particles and the compressive deformation amount are measured.

$$K_X = (3/\sqrt{2}) \cdot (S_X^{-3/2}) \cdot (R^{-1/2}) \cdot F_X$$

where $F_X$: load (N) necessary for X % displacement of the particles, $S_X$: compressive deformation amount (mm) upon X % displacement of the particles, and R: radius (mm) of the particles.

Incidentally, the $K_X$ value is a value expressing the hardness of the particles universally and quantitatively, so that it is possible, by using the X % K value as an embodiment in the present invention, to express the preferable hardness of the particles at X % displacement quantitatively and univocally.

In the conductive particles of an embodiment of the present invention, when the 50% K value ($K_{50}$) is less than 100 N/mm², the strength of the particles may be lowered, and when the 50% K value ($K_{50}$) exceeds 50000 N/mm², the flexibility of the particles may be unsatisfactory.

In consideration of these points, the 50% K value ($K_{50}$) is preferably 500 to 30000 N/mm², more preferably 1000 to 15000 N/mm², and most preferably 2000 to 10000 N/mm².

On the other hand, the recovery factor measured at 20° C. upon 50% displacement of particle diameter (hereinafter referred to as 50% compressive deformation recovery factor) is not less than 30%, preferably 35 to 80%, more preferably 40 to 70%, and most preferably 45 to 65%.

When the 50% compressive deformation recovery factor is less than 30%, the elasticity of the conductive particles obtained may be low and, for example, connection reliability in the case of using the conductive particles for connection between electrodes may be lowered. As for the upper limit of the recovery factor, 100% recovery is preferred, but, in practice, the recovery factor is not more than 90%.

The X % compressive deformation recovery factor in an embodiment of the present invention is a value obtained from measurement of the relationship between load value and compression displacement when the load is gradually lowered after the particles are compressed to X % of particle diameter by use of a micro-compression testing machine [a smooth end face of a diamond-made cylinder with a diameter of 50 μm of a micro-compression testing machine, MCT-W201, produced by Shimadzu Corporation]. This value is based on the measurement of the relationship by setting the end point of unloading at an origin load value of 0.02 gf (0.196 mN) and by setting the compression rate in loading and unloading at 0.145 gf/second (1.421 mN/second), and is represented by the ratio (L2/L1), in %, between the displacement (L1) up to the point of reversion and the displacement (L2) from the point of reversion to the point of obtaining the origin load value.

Incidentally, in this measuring apparatus, a retention time of 2 seconds is provided at the changeover from loading to unloading.

In addition, a larger compression displacement is considered to be generated among the particles, and, in that case also, capability of retaining the elasticity may be considered. In view of this, the compression displacement recovery factor of the conductive particles according to an embodiment of the present invention, specifically, the recovery factor at 55% displacement of particle diameter is preferably not less than 25%, more preferably 25 to 70%, and most preferably 30 to 55%. Furthermore, the recovery factor at 60% displacement of particle diameter, specifically, the recovery factor at 65% displacement of particle diameter is preferably not less than 20%, more preferably 20 to 60%, and most preferably 25 to 45%.

Incidentally, the K values ($K_{55}$, $K_{60}$, $K_{65}$) in this case also are preferably in the same range as that at the time of 50% displacement.

The conductive particles according to an embodiment of the present invention are capable of exhibiting at least such a compressive deformation characteristic that the recovery factor at 50% displacement of particle diameter of not less than 30%. Therefore, for example, even in the case of using the conductive particles to make electroconductive adhesion between electrodes by use of an anisotropic conductive adhesive (anisotropic conductive membrane or film), it is possible to prevent the electrodes or a substrate from being deformed or being damaged. In addition, conduction area can be enlarged while maintaining the gap, and the elastic force (repulsion) thereof is strong, so that connection resistance can be lowered stably, and connection reliability is enhanced.

Further, from the viewpoint of more enhancing the connection reliability of the conductive particles by obtaining softenedness and elasticity, the compressive elastic deformation characteristic $K_{20}$ at 20% displacement of particle diameter (hereinafter sometimes referred to as 20% K value) and the compressive elastic deformation characteristic $K_{30}$ at 30% displacement of particle diameter (hereinafter sometimes referred to as 30% K value) preferably satisfy the condition of $K_{20} \geq K_{30}$. With the relationship between the 20% K value and the 30% K value of the conductive particles set as above, it can be ensured that the particles are not liable to be broken even when a higher compressive load is exerted thereon, and soft and highly elastic particles having a high compression displacement and a high elasticity recoverability can be obtained.

Besides, from the viewpoint of compression displacement, the conductive particles according to an embodiment of the present invention preferably do not have a breaking point, or a point of inflection where compressive deformation factor increases abruptly, in a particle diameter displacement range of not more than 55%, preferably not more than 60%, and particularly not more than 65%. This makes it possible to further enhance hardness characteristics, quality, connection reliability and the like in the fields where the conductive particles are used.

In other words, it is preferable that the recovery from elastic displacement of the conductive particles according to an embodiment of the present invention is not recovery after breaking, recovery after displacement beyond a point of inflection, or the like, but is recovery generated within the range of elastic limit (elastic recovery).

Furthermore, the conductive particles according to an embodiment of the present invention have the following characteristics as high softness.

Figure 12:
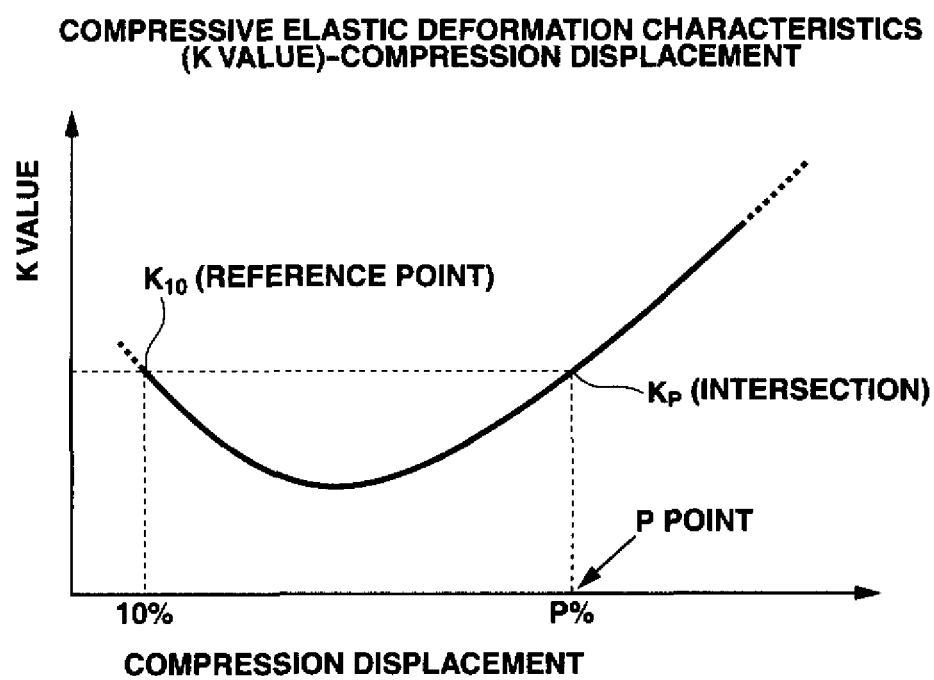
FIG. 12 is a graph showing the relationship between compressive elastic deformation characteristic (K value) and compression displacement of general conductive particles within the range of the elastic limit.

In general, when the compressive elastic deformation characteristic (K value)—compression displacement relationship is represented by a graph with the compressive elastic deformation characteristic $K_X$ taken on the axis of ordinates and with the compression displacement on the axis of abscissas, the conductive particles each having an conductive layer coating a polymer base particle show a characteristic of a curve having a lowermost point as shown in FIG. 12 in the range of elastic limit of the particles not having a point of inflection as to breakage or collapse.

This is due largely to the physical properties (inclusive of particle diameter) of the polymer base particles and the conductive layer; particularly, the particles with higher softness (compressibility under low load) depend more on the physical properties of the polymer base particles, and the position of the lowermost point is also varied.

When the compressive elastic deformation characteristic $K_{10}$ at 10% displacement of particle diameter (10% K value) measured at 20° C. in the compressive elastic deformation characteristic (K value)-compression displacement graph is taken as a reference point, a straight line passing through the reference point and being orthogonal to the compressive elastic deformation characteristic axis is drawn, and the intersection of the straight line with the graph other than the reference point is defined as $K_P$ point, then the conductive particles according to an embodiment of the present invention preferably has a compression displacement P of not less than 40%.

In other words, a higher value of the compression displacement P means a higher softness, and, on the contrary, a lower value of the compression displacement P means a higher hardness (lower softness). Therefore, the compression displacement P is preferably not less than 40%, more preferably not less than 45%, further preferably not less than 50%, and most preferably not less than 55%.

Thus, sufficient softness and elasticity characteristics are imparted to the conductive particles according to an embodiment of the present invention, whereby the connection reliability of the conductive particles as above-mentioned can be enhanced further.

Incidentally, particles which cannot have the $K_P$ point are particles which are too soft, like thermoplastic resin, to exhibit an elasticity recovering ability, or particles which are susceptible to breakage or collapse as above-mentioned, or particles which are lowered in recovering ability, and such particles cannot exhibit sufficient softness and elasticity characteristics.

In addition, attendant on the decrease in the size of circuit substrates and circuit base materials particularly recently, the circuit connection pitch width tends to be minuter, and, according to this trend, conductive particles smaller in diameter have come to be used for this purpose.

Such reduced-diameter particles, for example, conductive particles having softness and elasticity characteristics with a mean particle diameter of not more than 8 μm preferably have a compression displacement, measured at 20° C. when a compressive load on one particle is 9.8 mN (1 gf), of not less than 45%, more preferably not less than 50%, and further preferably not less than 55%.

With such softness and elasticity imparted to the conductive particles, the connection reliability of the conductive particles as above-mentioned can be enhanced further.

Particularly in consideration of hardness characteristics, quality, connection reliability and the like in the fields where the reduced-diameter conductive particles are used, it is favorable that at least the breaking strength preferably shows retention of a strength, in terms of compressive load on one conductive particle, of not less than 9.8 mN (1 gf), preferably not less than 12.7 mN (1.3 gf), and more preferably not less than 15.7 mN (1.6 gf).

In general, the physical properties such as hardness (breaking strength, etc.), softness (compressibility under low load), and elasticity (recovering ability after compression) of conductive particles composed mainly of a polymer depend greatly on the physical properties of the polymer particles. In the case of conductive particles obtained by coating polymer particles by such treatment as electroless plating, the physical properties of the conductive particles may be largely lowered, depending on the plating treatment step or on the kind of the metallic material used for coating and the physical properties such as hardness and specific gravity of the metallic material.

This phenomenon is seen conspicuously particularly in the case where a hard metallic material, such as nickel, is used; in this case, lowering in the physical properties, particularly breaking strength, of the conductive particles and large dispersion of the breaking strength are generated. Therefore, the conductive particles may not be able to exhibit sufficient polymer properties required in the case where the conductive particles are applied to a use in which a high breaking point is demanded.

The reason for this problem has not yet been elucidated. However, the present inventors presume that this problem arises from the generation of fused contact points between the polymer particle and the plating film, since:

(1) the surface of the polymer particle is modified through physical or chemical roughening by complicated steps such as a degreasing step, an etching step, a catalyst step, an accelerator step, etc.; and (2) the modified portion is provided with an anchoring effect and the metal is precipitated and anchored onto the modified portion in the plating step;

in the coating treatment step such as electroless plating. Specifically, it is presumed that when the plating film is broken under an external load in this condition, the attendant crack or impact exerts some bad influence on the polymer particle, thereby effecting a lowering in the physical properties such as a lowering in strength, braking, etc.

In order to efficiently restrain the generation of such a lowering in the physical properties of the conductive particles after the plating treatment, the polymer base particles constituting the conductive particles according to an embodiment of the present invention each preferably include a core particle, and a polymer coat layer (seed layer) formed on the surface of the core particle.

In other words, the polymer coat layer capable of protecting or absorbing a crack or impact generated attendant on the breakage of the conductive coating film under an external load is provided between the core particle and the conductive coating film formed by the plating treatment. This ensures that the physical properties intrinsic of the polymer base particles and the characteristics of the conductive particles can be mixed sufficiently, resulting in that it is possible to suppress the lowering in breaking strength and the dispersion of strength and to obtain conductive particles having specific soft and highly elastic characteristics.

Besides, in the present invention, let the compressive elastic deformation characteristic $K_{BX}$ of one polymer base particle at X % displacement of particle diameter be defined by the following formula [2]:

$$K_{BX} = (3/\sqrt{2}) \cdot (S_{BX}^{-3/2}) \cdot (R_B^{-1/2}) \cdot F_{BX} \qquad [2]$$

Where $F_{BX}$ is the load (N) necessary for X % displacement of the polymer base particles, $S_{BX}$ is the compressive deformation amount (mm) at X % displacement of the polymer base particles, and $R_B$ is the particle radius (mm) of the polymer base particles, then the polymer base particles constituting the conductive particles are preferably such that the compressive elastic deformation characteristic $K_{B60}$ at 60% displacement of particle diameter of the polymer base particles is 100 to 50000 N/mm² at 20° C., and the recovery factor of particle diameter of the polymer particles at 60% displacement of particle diameter of the polymer base particles is not less than 20% at 20° C.

Incidentally, like $K_X$, the $K_{BX}$ is also measured by use of a micro-compression testing machine (MCT-W201, produced by Shimadzu Corporation).

In the present invention, when the 60% K value ($K_{B60}$) of the polymer base particles is less than 100 N/mm², the strength of the conductive particles obtained by use of the polymer base particles may be lowered. On the other hand, when the 60% K value ($K_{B60}$) exceeds 50000 N/mm², the flexibility of the conductive particles may be insufficient.

In consideration of these points, the 60% K value ($K_{B60}$) is preferably 500 to 30000 N/mm², more preferably 1000 to 15000 N/mm², and most preferably 2000 to 10000 N/mm².

Incidentally, since the compression displacement characteristic, the elasticity characteristic and the like of the conductive particles depend heavily on the characteristics of the polymer base particles themselves, the compressive elastic deformation characteristic $K_{B20}$ at 20% displacement of particle diameter and the compressive elastic deformation characteristic $K_{B30}$ at 30% displacement of particle diameter in the above formula [2] preferably satisfy the condition of $K_{B20} \geq K_{B30}$. With the relationship between the $K_{B20}$ and the $K_{B30}$ of the polymer base particles set as above, the conductive particles obtained are not liable to be broken even a higher compressive load is exerted thereon, and the conductive particles can have soft and highly elastic characteristics with a high compression displacement and a high elasticity recovering ability.

On the other hand, the recovery factor at 20° C. at 60% displacement of particle diameter of the polymer base particles (hereinafter referred to as 60% compressive deformation recovery factor) is not less than 20%, preferably 25 to 80%, more preferably 30 to 70%, and most preferably 35 to 65%.

When the 60% compressive deformation recovery factor is less than 20%, the conductive particles obtained by use of the polymer base particles are low in elasticity, and, for example, the connection reliability in the case of using the conductive particles for connection between electrodes may be lowered. As for the upper limit of the recovery factor, a recovery factor of 100% is desirable, but, in practice, the recovery factor is not more than 90%.

Incidentally, like the compressive deformation recovery factor of the conductive particles, the compressive deformation recovery factor of the polymer base particles is also measured by use of a micro-compression testing machine (MCT-W201, produced by Shimadzu Corporation).

Furthermore, in the case where the polymer base particles constituting the conductive particles each include a core particle and a polymer coat layer, it is preferable that the compressive elastic deformation characteristic $K_{C10}$ of one particle at 10% displacement of particle diameter of the core particles and the compressive elastic deformation characteristic $K_{B10}$ of one particle at 10% displacement of particle diameter of the polymer base particles satisfy the following expression [3];

$$K_{C10} > K_{B10} \qquad [3]$$

With this relationship satisfied, it is possible to obtain conductive particles such that the lowering in the physical properties such as breaking strength after the plating treatment is restrained.

The constituent of the polymer coat layer is preferably softer than the constituent of the core particle. Particularly, it is preferable that the compressive elastic deformation characteristic $K_{C10}$ of one particle at 10% displacement of core particle diameter and the compressive elastic deformation characteristic $K_{S10}$ of one particle at 10% displacement of particle diameter of the particles of the constituent of the polymer coat layer (the mean particle diameters of the particles are measured in the range of ±10%) satisfy the following expression [4]:

$$K_{C10} > K_{S10} \qquad [4]$$

With such a relationship satisfied, the physical properties such as elasticity of the core particles having a heavy influence on the characteristics of the polymer base particles can be maintained, and it is possible to restrain the abrupt lowering in hardness due to crack, impact or the like at the time of breakage of the conductive coating film.

Incidentally, in the case where the constituent of the polymer coat layer is harder than the constituent of the core particle, it may be impossible to absorb the crack or impact attendant on the breakage of the conductive coating film, and the influence of the crack or impact may reach the core particle.

Furthermore, in order to sufficiently maintain the physical properties of the core particles, a configuration is preferably adopted in which the radius (Rc) of the core particles in the polymer base particles and the thickness (D) of the polymer coat layer satisfy the following expression [5]:

$$(Rc) > (D) \qquad [5],$$

preferably, $$(Rc) > (D) \times 10,$$

more preferably, $$(Rc) > (D) \times 30,$$

and most preferably, $$(Rc) > (D) \times 50.$$

In the present invention, the thickness of the polymer coat layer is preferably 0.005 to 1.0 µm, more preferably 0.01 to 0.3 µm, further preferably 0.02 to 0.1 µm, and most preferably 0.025 to 0.05 µm.

Even when the thickness of the polymer coat layer is less than 0.005 µm, the effect of the coating may be obtained, but it may be impossible in this case to maintain sufficiently the physical properties of the core particles. On the other hand, when the thickness of the polymer coat layer is more than 1.0 µm, the effect on maintaining the softness of the core particles can be obtained, but this setting may induce problems on a step basis in the case of forming the conductive layer by a plating treatment or may exert a bad influence on the particle physical properties such as heat resistance and solvent resistance.

Besides, in consideration of the frequent use of an aqueous medium in the plating treatment, for example, the material of the polymer coat layer is preferably hydrophobic. It should be noted here, however, the material may have a hydrophilic functional group as part of the molecular chain thereof.

The main constituent of the polymer coat layer is preferably a thermoplastic resin or a resin appropriately cross-linked and having elasticity. This makes it possible to prevent exfoliation due to dissolution of the coat layer, and to prevent bad influences of extreme erosion on the core particles in an acidic or alkaline plating bath.

Particularly, it is preferable to use, as the main constituent of the polymer coat layer, a resin composition highly resistant to the acid or alkali used in the plating treatment, whereby the bad influences of extreme erosion on the core particles can be prevented efficiently.

In the case where the main constituent of the polymer coat layer is a thermoplastic resin, the glass transition point of the resin is preferably −150 to 300° C., and more preferably 50 to 200° C. Particularly, an amorphous polymer is preferred.

Examples of the main constituent resin of the polymer coat layer include styrene resins, acrylic resins, methacrylic resins, polyethylene resins, polypropylene resins, vinyl resins, vinyl acetate resins, silicone resins, fluororesins, polyester resins, polyurethane resins, polycarbodiimide resins, copolymers thereof, and resins obtained by appropriately cross-linking these resins.

Among these resins, the styrene-based resins such as polystyrene, styrene component-containing resins and resins obtained by appropriately cross-linking these resins are preferred because they are resistant to acids and alkalis, are inexpensive and have elastic hardness.

With the configuration in which the polymer coat layer having the above-mentioned characteristics is provided as a spacer between the core particle and the conductive layer, it is possible to obtain conductive particles capable of maintaining sufficiently the physical properties intrinsic of the polymer particles.

The mean particle diameter of the conductive particles according to an embodiment of the present invention is preferably 0.1 to 100 µm, more preferably 0.2 to 30 µm, and further preferably 0.5 to 20 µm. When the mean particle diameter is less than 0.1 µm, the particles may be liable to aggregate. On the other hand, particles with a mean particle diameter in excess of 100 µm are rarely used. Particularly, with conductive particles having a particle diameter of not more than 20 µm, it is possible to cope with the recent trend toward a minuter circuit connection pitch width attendant on the reduction in the size of circuit substrates and circuit base materials.

In addition, the Cv value of the particle diameter is preferably not more than 20%. When the Cv value exceeds 20%, the performance of the conductive particles in use may be lowered (for example, control of the conductive particles as an electron spacer, the connection reliability thereof, etc. may be lowered). The Cv value of the particle diameter is preferably not more than 12%, more preferably not more than 8%, and most preferably not more than 5%.

Here, the Cv value is the value obtained by the following calculation formula:

$$Cv \text{ value } (\%) = (\text{standard deviation of particle diameter}/ \text{mean particle diameter}) \times 100.$$

Incidentally, the mean particle diameter and the Cv value (%) are the mean value of particle diameter measured in the condition where the particles are expressed in two dimensions after taking a photograph of the particles (n=300) at a measurable magnification (×300 to 200,000) by use of a scanning electron microscope (S-4800, produced by Hitachi High-Technologies Corporation; hereinafter referred to as SEM), and the Cv value (%) obtained based on the standard deviation of the particle diameter calculated therefrom.

The material of the polymer base particles (core particles) constituting the conductive particles according to an embodiment of the present invention is not particularly limited insofar as it is a polymeric compound (resin) component obtained by polymerization of a polymerizable monomer. Examples of the material include styrene resins, acrylic resins, methacrylic resins, polyethylene resins, polypropylene resins, silicone resins, polyester resins, polyurethane resins, polyamide resins, epoxy resins, polyvinyl butyral resins, rosin resins, terpene resins, phenolic resins, melamine resins, guanamine resins, oxazoline resins, carbodiimide resins, and cured resins obtained by cross-linking these resins. These resins may be used either singly or in combination of two or more of them.

The method of preparing the polymer base particles (core particles) is not particularly limited insofar as the polymer particles with the above-mentioned physical properties can be obtained by the method. In order to efficiently obtain the polymer base particles (core particles) constituting the conductive particles of an embodiment of the present invention which have the soft and highly elastic characteristics, there is preferably used a method in which starting monomers containing not less than 35 wt % of a monomer having at least two unsaturated double bonds in the molecule thereof are subjected to solution polymerization in a medium which dissolves the starting monomers but does not dissolve the particles produced.

Examples of the solution polymerization include (1) emulsion or suspension polymerization conducted in an aqueous solution, (2) dispersion polymerization conducted in a nonaqueous organic solvent or in a mixed solvent of water and a nonaqueous organic solvent in the presence of a dispersant, and (3) a combination of the (1) or (2) with a seed method.

Especially preferred is the dispersion polymerization because it ensures that the particle diameter can be controlled easily, the treatments in subsequent steps such as washing can be conducted easily, the desired micrometer-sized particles can be obtained without use of seed particles, a copolymer having a hydrophilic functional group or the like can be easily prepared, and it is possible to easily obtain particles better in deformation recovery factor after compressive deformation, particularly better in deformation recovery factor upon a high compression displacement, as compared with other polymerization methods. Besides, a precipitation polymerization method according to dispersion polymerization, as described in reference [Journal of Polymer Science. Part A: Polymer Chemistry, (USA), 31, 3257 (1993)] can also be used preferably.

In the present invention, when the content of the monomer having at least two unsaturated double bonds in its molecule in the starting monomers is less than 35 wt %, the deformation recovery factor after high compressive deformation of the polymer base particles (core particles) obtained may be lowered. In addition, when conductive particles obtained from the base particles (core particles) are used for connection between electrodes, the connection resistance may increase with the lapse of time, leading to loosing of connection reliability. From the viewpoint of enhancing the elasticity recovery factor, the content of the monomer having at least two unsaturated bonds in the starting monomers is preferably 40 to 95 wt %, more preferably 45 to 90 wt %, and most preferably 55 to 85 wt %.

The monomer having at least two unsaturated double bonds in its molecule is not particularly limited, and can be appropriately selected from among known polyfunctional vinyl monomers, polyfunctional (meth)acrylic acid ester acid derivatives and the like.

Specific examples of such a monomer include divinylbenzene; divinylbiphenyl; divinylnaphthalene; (poly)alkylene glycol di(meth)acrylates such as (poly)ethylene glycol di(meth)acrylate, (poly)propylene glycol di(meth)acrylate, (poly)tetramethylene glycol di(meth)acrylate, etc.; alkane diol di(meth)acrylates such as 1,6-hexanediol di(meth)acrylate, 1,8-octanediol di(meth)acrylate, 1,9-nonanediol di(meth)acrylate, 1,10-decanediol di(meth)acrylate, 1,12-dodecanediol di(meth)acrylate, 3-methyl-1,5-pentanediol di(meth)acrylate, 2,4-diethyl-1,5-pentanediol di(meth)acrylate, butylethylpropanediol di(meth)acrylate, 3-methyl-1,7-octanediol di(meth)acrylate, 2-methyl-1,8-octanediol di(meth)acrylate, etc.; neopentyl glycol di(meth)acrylate, trimethylolpropane tri(meth)acrylate, tetramethylolmethane tri (meth)acrylate, tetramethylolpropane tetra(meth)acrylate, pentaerythritol tri(meth)acrylate, ethoxylated cyclohexanedimethanol di(meth)acrylate, ethoxylated bisphenol A di(meth)acrylate, tricyclodecanedimethanol di(meth)acrylate, propoxylated ethoxylated bisphenol A di(meth)acrylate, 1,1,1-trishydroxymethylethane di(meth)acrylate, 1,1,1-trishydroxymethylethane tri(meth)acrylate, 1,1,1-trishydroxymethylpropane triacrylate, diallyl phthalate and isomers thereof, triallyl isocyanurate and derivatives thereof, etc.

Incidentally, specific product examples of these monomers include NK Esters [A-TMPT-6PO, A-TMPT-3E0, A-TMM-3LMN, A-GLY Series, A-9300, AD-TMP, AD-TMP-4CL, ATM-4E, A-DPH], produced by Shin-Nakamura Chemical Co., Ltd. These monomers may be used either singly or in combination of two or more of them.

Among these monomers, monomers including at least one selected from divinylbenzene and the polyfunctional (meth) acrylate monomers are preferably used. With these monomers used, the recovery factor after high compressive deformation of the polymer base particles obtained can be easily enhanced.

Besides, in order to further enhance the recovery factor after high compressive deformation of the polymer base particles obtained, use of monomers including a di(meth)acrylate monomer is preferred, use of monomers including a $C_6$-$C_{18}$ alkanediol di(meth)acrylate is more preferred, and use of monomers including a $C_1$-$C_{12}$ alkanediol di(meth) acrylate is most preferred.

Furthermore, from the viewpoint of maintaining good balance between compressive elasticity characteristic $K_X$ ($K_{BX}$) and recovery factor after high compressive deformation, a copolymer obtained by using divinylbenzene and a polyfunctional (meth)acrylate monomer in combination is preferred.

In addition to the monomer having at least two unsaturated double bonds in its molecule, a polymerizable monomer copolymerizable therewith can be used together.

This polymerizable monomer can be used in an arbitrary proportion within the range of 0 to 65 wt % in the starting monomers, and the proportion is preferably 5 to 60 wt %, more preferably 10 to 55 wt %, and further preferably 15 to 45 wt %, correspondingly to the preferable amount of the monomer having at least two unsaturated double bonds in its molecule used.

Specific examples of the polymerizable monomer include (i) styrenes such as styrene, o-methylstyrene, m-methylstyrene, p-methylstyrene, α-methylstyrene, o-ethylstyrene, m-ethylstyrene, p-ethylstyrene, 2,4-dimethylstyrene, p-n-butylstyrene, p-t-butylstyrene, p-n-hexylstyrene, p-n-octylstyrene, p-n-nonylstyrene, p-n-decylstyrene, p-n-dodecylstyrene, p-methoxystyrene, p-phenylstyrene, p-chlorostyrene, 3,4-dichlorostyrene, etc., (ii) (meth)acrylates such as methyl acrylate, ethyl acrylate, propyl acrylate, n-butyl acrylate, isobutyl acrylate, hexyl acrylate, 2-ethylhexyl acrylate, n-octyl acrylate, dodecyl acrylate, lauryl acrylate, stearyl acrylate, 2-chloroethyl acrylate, phenyl acrylate, methyl α-chloroacrylate, methyl methacrylate, ethyl methacrylate, propyl methacrylate, n-butyl methacrylate, isobutyl methacrylate, hexyl methacrylate, 2-ethylhexyl methacrylate, n-octyl methacrylate, dodecyl methacrylate, lauryl methacrylate, stearyl methacrylate, etc., (iii) vinyl esters such as vinyl acetate, vinyl propionate, vinyl benzoate, vinyl butyrate, etc., (iv) N-vinyl compounds such as N-vinylpyrrole, N-vinylcarbazole, N-vinylindole, N-vinylpyrrolidone, etc., (v) fluoroalkyl-containing (meth)acrylates such as vinyl fluoride, vinylidene fluoride, tetrafluoroethylene, hexafluoropropylene, trifluoroethyl acrylate, tetrafluoropropyl acrylate, etc., and (vi) conjugate dienes such as butadiene, isoprene, etc. These polymerizable monomers may be used either singly or in combination of two or more of them.

Among these polymerizable monomers, preferably used as polymerizable monomers are styrenes, (meth)acrylates, vinyl esters and the like, whereby polymer base particles having the above-mentioned physical properties can be obtained efficiently.

Particularly, among the above-mentioned polymerizable monomers, an unsaturated monomer having a hydrophilic functional group or an active hydrogen group in its molecule is desirably used as a starting monomer, from the viewpoint of maintaining or regulating the monodispersibility and soft and elastic characteristics of the particles obtained.

Examples of the hydrophilic functional group or active hydrogen group include amino group, carboxyl group, hydroxyl group, thiol group, carbonyl group, ether group, cyano group, amide group, sulfonic acid group, phosphoric acid group, quaternary ammonium (salt) group, and alkylene oxide groups. Incidentally, only one kind of functional group may be present, or two or more kinds of functional groups may be present in combination, in the unsaturated monomer.

The unsaturated monomer having a hydrophilic functional group or active hydrogen group in its molecule is preferably used in an arbitrary proportion within the range of not less than 3 wt % in the starting monomers, whereby the intended effect thereof can be expected. The proportion is preferably 3 to 65 wt %, more preferably 5 to 50 wt %, and further preferably 10 to 40 wt %, correspondingly to the preferable use amounts of the monomer having at least two unsaturated double bonds in its molecule and other polymerizable monomer(s) copolymerizable therewith.

Examples of the unsaturated monomer having a hydrophilic functional group or active hydrogen group in its molecule include the following. In the following description, "C" means a carbon atom.

(1) Amino Group-Containing Monomers

Amino group-containing monomers include amino group-containing alkyl (meth)acrylate derivatives such as aminoethyl acrylate, N-propylaminoethyl acrylate, N-ethylaminopropyl (meth)acrylate, N-phenylaminoethyl (meth)acrylate, N-cyclohexylaminoethyl (meth)acrylate, etc., allylamine derivatives such as allylamine, N-methylallylamine, etc., amino group-containing styrene derivatives such as p-aminostyrene, etc., and triazine derivatives such as 2-vinyl-4,6-diamino-S-triazine, etc. Among these monomers, preferred are the compounds having a primary or secondary amino group. Incidentally, these compounds may be used either singly or in combination of two or more of them.

(2) Carboxyl Group-Containing Monomers

Carboxyl group-containing monomers include unsaturated carboxylic acids such as acrylic acid, methacrylic acid, crotonic acid, cinnamic acid, itaconic acid, maleic acid, fumaric acid, etc., C1-8 alkyl itaconates such as monobutyl itaconate, etc., C1-8 alkyl maleates such as monobutyl maleate, etc., vinyl group-containing aromatic carboxylic acids such as vinylbenzoic acid, etc. and salts thereof. Incidentally, these compounds may be used either singly or in combination of two or more of them.

(3) Hydroxyl Group-Containing Monomers

Hydroxyl group-containing monomers include hydroxyl group-containing (meth)acrylic monomers such as 2-hydroxyethyl (meth)acrylate, 2-hydroxypropyl (meth)acrylate, 3-hydroxypropyl (meth)acrylate, 4-hydroxybutyl (meth) acrylate, etc., (poly)alkylene glycol (meth)acrylic monomers such as (poly)ethylene glycol mono(meth)acrylate, (poly) propylene glycol mono(meth)acrylate, etc., hydroxyalkyl vinyl ether monomers such as hydroxyethyl vinyl ether, hydroxybutyl vinyl ether, etc., and hydroxyl group-containing allyl monomers such as allyl alcohol, 2-hydroxyethyl allyl ether, etc. Incidentally, these compounds may be used either singly or in combination of two or more of them.

(4) Thiol(Mercapto) Group-Containing Monomers

Thiol(mercapto) group-containing monomers include 2-mercaptoethyl (meth)acrylate, 2-mercapto-1-carboxyethyl (meth)acrylate, N-(2-mercaptoethyl)acrylamide, N-(2-mercapto-1-carboxyethyl)acrylamide, N-(2-mercaptoethyl)

methacrylamide, N-(4-mercaptophenyl)acrylamide, N-(7-mercaptonaphthyl)acrylamide, maleic acid mono-2-mercaptoethylamide, etc.

(5) Carbonyl Group-Containing Monomers

Carbonyl group-containing monomers include vinyl ketones such as vinyl methyl ketone, vinyl hexyl ketone, methyl iropropenyl ketone, etc.

Incidentally, the above-mentioned compounds may be used either singly or in combination of two or more of them.

(6) Ether Group-Containing Monomers

Ether group-containing monomers include vinyl ether monomers such as vinyl methyl ether, vinyl ethyl ether, vinyl isobutyl ether, etc.

(7) Cyano Group-Containing Monomers

Cyano group-containing monomers include acrylonitrile, methacrylonitrile, hexenenitrile, 4-pentenenitrile, p-cyanostyrene, etc.

Incidentally, the above-mentioned compounds may be used either singly or in combination of two or more of them.

(8) Amide Group-Containing Monomers

Amide group-containing monomers include (meth)acrylamide, α-ethyl (meth)acrylamide, N-methyl (meth)acrylamide, N-butoxymethyl (meth)acrylamide, diacetone (meth) acrylamide, N,N-dimethyl (meth)acrylamide, N,N-diethyl (meth)acrylamide, N,N-dimethyl-p-styrene sulfonamide, N,N-dimethylaminoethyl (meth)acrylamide, N,N-diethylaminoethyl (meth)acrylamide, N,N-dimethylaminopropyl (meth)acrylamide, N,N-diethylaminopropyl (meth)acrylamide, etc. Incidentally, these compound may be used either singly or in combination of two or more of them.

(9) Sulfone Group-Containing Monomers

Sulfone group-containing monomers include alkenesulfonic acids such as ethylenesulfonic acid, vinylsulfonic acid, (meth)allylsulfonic group, etc., aromatic sulfonic acids such as styrenesulfonic acid, α-methylstyrenesulfonic acid, etc., C1-10 alkyl (meth)allylsulfosuccinates, sulfo C2-6 alkyl (meth)acrylates such as sulfopropyl (meth)acrylate, etc., sulfonic group-containing unsaturated esters such as methyl vinylsulfonate, 2-hydroxy-3-(meth)acryloxypropylsulfonic acid, 2-(meth)acryloylamino-2,2-dimethylethanesulfonic acid, 3-(meth)acryloyloxyethanesulfonic acid, 3-(meth)acryloyloxy-2-hydroxypropanesulfonic acid, 2-(meth)acrylamido-2-methylpropanesulfonic acid, 3-(meth)acrylamido-2-hydroxypropanesulfonic acid, etc. and salts thereof.

(10) Phosphoric Acid Group-Containing Monomers

Phosphoric acid group-containing monomers include phosphoric monoesters of hydroxyalkyl (meth)acrylate such as 2-hydroxyethyl (meth)acryloylphosphate, phenyl-2-acryloyloxyethyl phosphate, etc., phosphoric acid group-containing unsaturated esters such as vinyl phosphate, etc. and salts thereof.

Incidentally, the above-mentioned compounds may be used either singly or in combination of two or more of them.

(11) Quaternary Ammonium (Salt) Group-Containing Monomers

Quaternary ammonium (salt) group-containing monomers include compounds obtained by converting a tertiary compound into a quaternary compound by use of a quaternary compound forming agent such as C1-12 alkyl chlorides, dialkylsulfuric acids, dialkyl carbonates, benzyl chloride, etc.

Specific examples of the quaternary ammonium (salt) group-containing monomers include alkyl (meth)acrylate quaternary ammonium salts such as 2-(meth)acryloyloxyethyltrimethylammonium chloride, 2-(meth)acryloxyloxyethyltrimethylammonium bromide, (meth)acryloyloxyethyltriethylammonium chloride, (meth)acryloyloxyethyldimethylbenzylammonium chloride, (meth)acryloyloxyethylmethylmorpholinoammonium chloride, etc., alkyl (meth)acrylamide quaternary ammonium salts such as (meth)acryloylaminoethyltrimethylammonium chloride, (meth)acryloylaminoethyltrimethylammonium bromide, (meth)acryloylaminoethyltriethylammonium chloride, (meth)acryloylaminoethyldimethylbenzylammonium chloride, etc., dimethyldiallylammonium methyl sulfate, trimethylvinylphenylammonium chloride, tetrabutylammonium (meth)acrylate, trimethylbenzylammonium (meth)acrylate, 2-(methacryloyloxy)ethyltrimethylammonium dimethyl phosphate, etc. Incidentally, these compounds may be used either singly or in combination of two or more of them.

(12) Alkylene Oxide Group-Containing Monomers

Alkylene oxide group-containing monomers include (poly)alkylene glycol (meth)acrylic monomers such as (poly) ethylene glycol mono(meth)acrylate, (poly)propylene glycol mono(meth)acrylate, etc., and alkoxy(poly)alkylene glycol (meth)acrylic monomers such as methoxy(poly)ethylene glycol mono(meth)acrylate, methoxy(poly)propylene glycol mono(meth)acrylate, etc. Incidentally, these compounds may be used either singly or in combination of two or more of them.

Among the unsaturated monomers having a hydrophilic functional group or active hydrogen group as above, preferred are those monomers which have a functional group selected from among hydroxyl group, carboxyl group, amino group, amide group and alkylene oxide groups, and particularly preferred are those monomers which have a functional group selected from among hydroxyl group, carboxyl group and ethylene oxide group. The use of such a functional group ensures strong repulsion between the particles obtained in the solution, so that the stability of the disperse system is enhanced, the monodispersibility can be enhanced more, and it is possible to obtain polymer base particles excellent in heat resistance, chemical resistance, reactivity, solution dispersibility, powder dispersibility, mechanical properties and the like.

Furthermore, the unsaturated monomer having a hydrophilic functional group or active hydrogen group in its molecule is preferably a water-soluble compound. The use of such a water-soluble monomer makes it possible to further enhance the monodispersibility, and to easily achieve monodispersion of the thus obtained polymer base particles in water or an aqueous medium.

A polymerization initiator to be used is not particularly limited, and can be appropriately selected from among known radical polymerization initiators. Specific examples of the radical polymerization initiator include peroxides such as benzoyl peroxide, cumene hydroperoxide, t-butyl hydroperoxide, sodium persulfate, ammonium persulfate, etc., and azo compounds such as azobisisobutyronitrile, azobismethylbutyronitrile, azobisisovaleronitrile, etc. These may be used either singly or in combination of two or more of them. The amount of the radical polymerization initiator to be used is normally 0.1 to 50 parts by weight per 100 parts by weight of the starting monomer(s).

A solvent (medium) for synthesis of the polymer base particles is not particularly limited insofar as the solvent (medium) dissolves the starting monomer(s) but does not dissolve the particles produced. The solvent (medium) may be appropriately selected from general solvents, according to the starting materials used and the like factors.

Examples of the solvent which can be used here include water; alcohols such as methanol, ethanol, 1-propanol, 2-propanol, 1-butanol, 2-butanol, isobutyl alcohol, tert-butyl alcohol, 1-pentanol, 2-pentanol, 3-pentanol, 2-methyl-1-butanol, isopentyl alcohol, tert-pentyl alcohol, 1-hexanol, 2-methyl-1-pentanol, 4-methyl-2-pentanol, 2-ethylbutanol, 1-heptanol, 2-heptanol, 3-heptanol, 2-octanol, 2-ethyl-1-hexanol, benzyl alcohol, cyclohexanol, etc.; ether alcohols such as methyl cellosolve, ethyl cellosolve, isopropyl cellosolve, butyl cellosolve, diethylene glycol monoethyl ether, diethylene glycol monobutyl ether, methyl carbitol, ethyl carbitol, butyl carbitol, etc.; ketones such as acetone, methyl ethyl ketone, methyl isobutyl ketone, cyclohexanone, etc.; esters such as ethyl acetate, butyl acetate, ethyl propionate, (alkyl) cellosolve acetate, diethylene glycol monoether ether acetate, diethylene glycol monobutyl ether acetate, etc.; aliphatic or aromatic hydrocarbons such as pentane, 2-methylbutane, n-hexane, cyclohexane, 2-methylpentane, 2,2-dimethylbutane, 2,3-dimethylbutane, heptane, n-octane, isooctane, 2,2,3-trimethylpentane, decane, nonane, cyclopentane, methylcyclopentane, methylcyclohexane, ethylcyclohexane, p-menthane, dicyclohexyl, benzene, toluene, xylene, ethylbenzene, etc.; halogenated hydrocarbons such as carbon tetrachloride, trichloroethylene, chlorobenzene, tetrabromoethane, etc.; ethers such as ethyl ether, dimethyl ether, trioxane, tetrahydrofuran, etc.; acetals such as methylal, diethyl acetal, etc.; fatty acids such as formic acid, acetic acid, propionic acid, etc.; and sulfur- or nitrogen-containing organic compounds such as nitropropene, nitrobenzene, dimethylamine, monoethanolamine, pyridine, dimethylformamide, dimethyl sulfoxide, acetonitrile, N-methyl-2-pyrrolidone, etc. These may be used either singly or in combination of two or more of them.

Incidentally, use of mixed media obtained from among the above-mentioned solvents by addition of an appropriate amount of a water-soluble medium having a boiling point of not less than 105° C., such as methyl cellosolve acetate, diethylene glycol monoethyl ether, diethylene glycol monobutyl ether, diethylene glycol monoethyl ether acetate, dimethylformamide, N-methyl-2-pyrrolidone, etc. is preferred, from the viewpoint of controllability of particle diameter and dispersibility. Particularly preferred are mixed media obtained by addition of an appropriate amount of a medium having a boiling point of not less than 140° C.

The amount of the starting monomer(s) contained in the reaction solution, based on the whole reaction solution, is preferably 1 to 50 wt %, more preferably 2 to 30 wt %, further preferably 3 to 20 wt %, and most preferably 6 to 15 wt %.

When the content of the starting monomer(s) exceeds 50 wt %, it is difficult for the polymer base particles having the above-mentioned physical properties to be obtained in a monodispersed state and in a high yield. On the other hand, when the content of the starting monomer(s) is less than 1 wt %, a long time is needed to complete the reaction, which is impractical from an industrial point of view.

The reaction temperature of polymerization varies depending also on the kind of the solvent used, and cannot be specified generally. Normally, the reaction temperature is about 10 to 200° C., preferably 30 to 130° C., and more preferably 40 to 90° C.

In addition, the reaction time is not particularly limited insofar as it is necessary for substantial completion of the desired reaction, and depends greatly on the kind(s) and amount(s) of the monomer(s), the viscosity and concentration of the solution, the desired particle diameter, and the like factors. For example, in the case of a reaction temperature of 40 to 90° C., the reaction time is about 1 to 72 hours, preferably about 2 to 24 hours.

Incidentally, the particles obtained may be set to have an appropriate form according to the intended use thereof; for example, the particles may be set to be particles having a core-shell structure by seed polymerization, or may be set to be composite particles into which an other reactive functional group or the like has been introduced.

Furthermore, in preparation of the polymer base particles, the polymerization reaction is preferably carried out in the presence of an organic compound which has five or more carbon atoms in its molecule and which does not react with the starting monomer(s) under the polymerization conditions.

The coexistence of such an organic compound in the reaction system makes it possible to enhance the dispersibility of the polymer base particles produced, and to control the particle diameter more evenly.

The organic compound having five or more carbon atoms in its molecule is not particularly limited, insofar as it is solid or liquid at normal temperature, it can be mixed (or dispersed) or dissolved in the medium being used, and it does not adversely affect the formation of the polymer base particles. It is favorable that the organic compound has a melting point of not more than 80° C., preferably not more than 60° C., more preferably not more than 40° C., and further preferably not more than 30° C. When the organic compound has a comparatively low melting point of about 80° C. or below, it can be used as the solvent (medium) in such a range as not to spoil the effects of the present invention.

It suffices for the organic compound to have five or more carbon atoms in its molecule. In view of the necessity for the organic compound to coexist under the polymerization conditions and in consideration of the volatility and boiling point or the like of the organic compound, however, the number of carbon atoms in the molecule of the organic compound is preferably not less than 6, more preferably not less than 8, and most preferably not less than 10.

Besides, the amount of the organic compound added is about 0.1 to 50 wt %, preferably about 1 to 25 wt %, and more preferably 2 to 10 wt %, based on the amount of the polymerization medium. When the addition amount exceeds 50 wt %, the viscosity of the reaction solution as a whole may be raised, depending on the organic compound, thereby making it difficult to evenly control the particle diameter. On the other hand, if the addition amount is less than 0.1 wt %, the effect of the organic compound on monodispersion of the particles may become insufficient.

In order to enhance the effect of the organic compound on monodispersion of the particles, it is preferable to use at least one selected from among hydrocarbon compounds and siloxane compounds, as the organic compound.

The hydrocarbon compounds here include compounds having a hydrocarbon group, such as aliphatic chain hydrocarbons such as saturated hydrocarbons, unsaturated hydrocarbons, etc., alicyclic hydrocarbons, aromatic hydrocarbons, higher alcohols, higher fatty acids, fats and oils, waxes, oils such as vegetable oils, mineral oils, petroleum products, etc., and their derivatives, etc.

Among these hydrocarbon compounds, preferred are aliphatic chain hydrocarbons, alicyclic hydrocarbons, aromatic hydrocarbons, and oils.

In addition, siloxane compounds are preferably organic polysiloxanes (silicones).

The hydrocarbons and siloxane compounds may be used either singly or in combination or two or more of them.

Incidentally, the organic compound having five or more carbon atoms in its molecule as above-described is preferably a hydrophobic compound, from the viewpoint of enhancing the monodispersion efficiency.

In the present invention, in carrying out the preparation of the polymer base particles, other (polymer) dispersant, stabilizer, emulsifier (surfactant) and the like than the above-mentioned components may be used according to the polymerization method, in an appropriate amount of 0.01 to 50 wt % based on the amount of the starting monomer(s).

Examples of the dispersant and stabilizer include various hydrophobic or hydrophilic dispersants and stabilizers, such as polystyrene derivatives such as polyhydroxystyrene, polystyrenesulfonic acid, vinylphenol-(meth)acrylic ester copolymer, styrene-(meth)acrylic ester copolymer, styrene-vinylphenol-(meth)acrylic ester copolymer, etc.; poly(meth)acrylic acid derivatives such as poly(meth)acrylic acid, poly(meth)acrylamide, polyacrylonitrile, polyethyl (meth)acrylate, polybutyl (meth)acrylate, etc.; polyvinyl alkyl ether derivatives such as polymethyl vinyl ether, polyethyl vinyl ether, polybutyl vinyl ether, polyisobutyl vinyl ether, etc.; cellulose derivatives such as cellulose, methyl cellulose, cellulose acetate, cellulose nitrate, hydroxymethyl cellulose, hydroxyethyl cellulose, hydroxypropyl cellulose, carboxymethyl cellulose, etc.; polyvinyl acetate derivatives such as polyvinyl alcohol, polyvinyl butyral, polyvinyl formal, polyvinyl acetate, etc.; nitrogen-containing polymer derivatives such as polyvinyl pyridine, polyvinyl pyrrolidone, polyethyleneimine, poly-2-methyl-2-oxazoline, etc.; and polyhalogenated vinyl derivatives such as polyvinyl chloride, polyvinylidene chloride, etc. These may be used either singly or in combination of two or more of them.

Examples of the emulsifier (surfactant) include anionic emulsifiers such as alkylsulfuric ester salts such as sodium laurylsulfate, alkylbenzenesulfonic acid salts such as sodium dodecylbenzenesulfonate, alkylnaphthalenesulfonic acid salts, fatty acid salts, alkylphosphoric acid salts, alkylsulfosuccinic acid salts, etc.; cationic emulsifiers such as alkylamine salts, quaternary ammonium salts, alkylbetaines, amine oxides, etc.; and nonionic emulsifiers such as polyoxyethylene alkyl ethers, polyoxyethylene alkyl allyl ethers, polyoxyethylene alkyl phenyl ethers, sorbitan fatty acid esters, glycerine fatty acid esters, polyoxyethylene fatty acid esters, etc. These may be used either singly or in combination of two or more of them.

In the case where the polymer base particles each include a core particle and a polymer coat layer formed on the surface of the core particle, the method of forming the polymer coat layer (seed layer) on the core particle surfaces may be, for example, a spraying method, a mechanical technique, a physical technique, a chemical technique or the like. Among these methods or techniques, the techniques of forming the seed layer in a solution as exemplified in the following (1) to (3) are preferably used, from the viewpoints of monodispersibility and control of the particle diameter and the seed layer (thickness).

(1) The core particles are dispersed in a solvent, and the seed layer is obtained by a seed method using a polymerizable compound (in the case where a mother liquor of the core particles produced is present, the seed method may be carried out on the basis of the mother liquor).
(2) The core particles are dispersed in a medium in which a compound such as a polymer is dissolved, and the seed layer is deposited on the core particle surfaces by appropriate conversion to a poor solvent.
(3) The core particle surfaces are preliminarily modified with a polymerizable functional group, and the seed layer is obtained by grafting a polymerizable compound in medium dispersing.

Among these techniques, particularly preferred are the techniques of (1) and (2) which yield a structure such that the impact upon breakage of the conductive layer would not easily exert an influence on the inside of the core particles. Where the core particle and the polymer coat layer are firmly (chemically) joined to each other, as by grafting, it may be impossible to maintain the physical properties desired.

Incidentally, these techniques may be used either singly or in combination of two or more of them. In addition, the seed layer may be a single layer or is composed of a plurality of layers.

The conductive particles according to an embodiment of the present invention have a structure in which a conductive layer of a conductive material is formed on the surfaces of the polymer base particles (polymer coat layer).

The metallic material constituting the conductive layer is not particularly limited. Examples of the metallic material which can be adopted include copper, nickel, cobalt, palladium, gold, platinum, rhodium, silver, zinc, iron, lead, tin, aluminum, indium, chromium, antimony, bismuth, germanium, cadmium, and silicon. These metallic materials may be used either singly or in combination of two or more of them.

The thickness of the conductive layer is normally about 0.01 to 10.0 µm, preferably 0.01 to 1.0 µm, more preferably 0.05 to 0.5 µm, and most preferably 0.08 to 0.2 µm. When the thickness of the conductive layer is less than 0.01 µm, it is difficult to obtain the desired conductivity. When the thickness exceeds 10 µm, on the other hand, the usefulness of the conductive layer is poor from the viewpoint of specific gravity and cost; in addition, the flexibility of the conductive particles according to an embodiment of the present invention is not exhibited effectively, and the conductive particles are liable to aggregate together in the step.

The method of forming the conductive layer is not particularly limited. Examples of the method which can be used include a method based on electroless plating, a method of coating the polymer base particles with a fine metallic powder alone, a method of coating the particles with a paste obtained by mixing a metallic powder with a binder, and physical vapor deposition methods such as vacuum vapor deposition, ion plating, and ion sputtering. Among these methods, the electroless plating method is preferred, in consideration of the dispersibility of the particles obtained, the evenness of the thickness of the conductive layer, and the like.

Examples of the electroless plating method include a method in which a complexing agent is added to the polymer base particles contained in an aqueous slurry prepared by the known technique and equipment, to effect sufficient dispersion of the polymer base particles, and then a chemical liquid constituting an electroless metal plating solution is added to the system, to form a metallic coating on the surfaces of the polymer base particles.

The complexing agent may be appropriately selected from known various compounds having a complexing action on the metallic ion used. Examples of the complexing agent include carboxylic acids (and their salts) such as citric aid, hydroxyacetic acid, tartaric acid, malic aid, lactic acid, gluconic acid and their alkali metal salts and ammonium salts, etc.; amino acids such as glycine, etc.; amines such as ethylenediamine, alkylamines, etc.; ammonium; EDTA; and pyrophosphoric acid (salts).

In addition, as the electroless plating solution, there may be preferably used those solutions which contain at least one metal selected from among copper, nickel, cobalt, palladium, gold, platinum, rhodium and the like. Normally, solutions obtained by adding aqueous solutions of a reducing agent such as sodium hypophosphite, hydrazine, sodium borohydride, etc. and a pH regulator such as sodium hydroxide to a salt of the above-mentioned at least one metal are used. Incidentally, electroless plating solutions containing a metal such as copper, nickel, silver, gold, etc. are commercially available inexpensively.

The electroless plating layer coating the polymer base particles is not particularly limited, insofar as it is a layer containing the above-mentioned metal(s). However, the electroless plating layer is preferably a plating film of nickel or a nickel alloy, and may be a multilayer film including at least one layer of the plating film. The nickel or nickel alloy film is advantageous in that it is firmly adhered to the polymer base particle, thereby forming an electroless plating layer with good exfoliation resistance. In addition, in the case where other metallic layer(s) are to be formed on the nickel or nickel alloy film to form a multilayer film, the nickel or nickel alloy film is advantageous in that it functions effectively as an intermediate layer capable of securing firm bond to the metallic layer formed thereon.

Examples of the nickel alloy include nickel-phosphorus, and nickel-boron. While the contents of phosphorus and boron in the alloy films are not particularly limited, but they are preferably 1 to 15 wt %, and 0.5 to 3 wt %, respectively.

A preferred example of the multilayer film is a nickel-gold multilayer film. This multilayer film is better than a nickel monolayer film in conduction performance.

As an example of the electroless plating treatment, an electroless nickel plating method will be described below.

First, a catalyst forming treatment step is conducted in which palladium ions are captured on the surfaces of the polymer base particles, followed by reducing the palladium ions to cause palladium to be supported on the surfaces of the polymer base particles. Thereafter, an electroless plating treatment step is carried out in which an aqueous slurry of the polymer base particles with palladium thereon is added to an electroless plating bath containing at least a nickel salt, a reducing agent, a complexing agent and the like, to obtain conductive particles.

The catalyst forming treatment step will be described specifically.

Since the electroless plating treatment is carried out in an aqueous system, in the case where the polymer base particles are hydrophobic it is necessary to render the particles hydrophilic by use of an acid or an alkali prior to the catalyst forming treatment step. The acid or alkali may be appropriately selected according to the characteristics of the polymer base particles. Subsequently, if necessary, a modifying treatment is conducted to impart a catalyst capturing ability to the surfaces of the polymer base particles. The catalyst capturing ability is the function of being able to capture palladium ions in the form of a chelate or salt onto the surfaces of the polymer base particles in the catalyst forming treatment step. In general, particles having on their surfaces at least one group selected from among amino group, imino group, amide group, imide group, cyano group, hydroxyl group, nitrile group and carboxyl group have the catalyst capturing ability.

In the case where the polymer base particles do not have the catalyst capturing ability, it is necessary to impart the catalyst capturing ability to the polymer base particles by a surface treatment. This modification can be carried out by the method described in JP-A 61-64882, in which an epoxy resin capable of being cured by an amino-substituted organosilane coupling agent or an amine curing agent is used.

In the catalyst forming treatment step, the polymer base particles are dispersed sufficiently in a diluted acidic aqueous solution of palladium chloride so that palladium ions are captured onto the surfaces of the particles. In this case, it suffices that the concentration of the aqueous solution of palladium chloride is in the range of 0.05 to 1 g/L. Subsequently, repulping washing is conducted, and the palladium ions captured onto the surfaces of the polymer base particles are reduced, whereby palladium is captured on the surfaces of the polymer base particles. The reducing treatment is carried out by preliminarily slurring the polymer base particles to sufficiently disperse the polymer base particles, and adding an aqueous solution of a reducing agent to the slurry.

Examples of the reducing agent used here include sodium hypophosphite, sodium borohydride, potassium borohydride, dimethylamineborane, hydrazine, and formalin. The amount of the reducing agent added varies depending on the specific surface area of the polymer base particles; in general, the addition amount is suitably in the range of 0.01 to 10 g/L based on the slurry.

Now, the electroless plating treatment step will be described below.

First, the polymer base particles having undergone the catalyst forming treatment are dispersed sufficiently in water in an amount of 1 to 500 g/L, preferably 5 to 300 g/L, to prepare an aqueous slurry. The dispersing operation here can be conducted by ordinary stirring, high-speed stirring or by use of a shear dispersing apparatus such as a colloid mill and a homogenizer. Besides, ultrasonic waves may be used in addition to the dispersing operation, and, further, a dispersant such as a surfactant may also be used, as required.

Subsequently, the polymer base particle slurry having undergone the dispersing treatment is added to an electroless plating bath containing a nickel salt, a reducing agent, a complexing agent, various additives and the like, to conduct electroless plating.

In this case, examples of the nickel salt include nickel chloride, nickel sulfate, and nickel acetate, and the concentration of the nickel salt in the plating bath is in the range of 0.1 to 50 g/L.

Examples of the reducing agent include sodium hypophosphite, dimethylamineborane, sodium borohydride, potassium borohydride, and hydrazine, and the concentration of the reducing agent in the plating bath is in the range of 0.1 to 50 g/L.

Examples of the complexing agent include those compounds which have a complexing action on nickel ions, such as carboxylic acids (and their salts) such as citric aid, hydroxyacetic acid, tartaric acid, malic aid, lactic acid, gluconic acid and their alkali metal salts and ammonium salts, etc.; amino acids such as glycine, etc.; amines such as ethylenediamine, alkylamines, etc.; ammonium; EDTA; and pyrophosphoric acid (salts). These compounds may be used either singly or in combination of two or more of them. The concentration of the complexing agent in the plating bath is in the range of 1 to 100 g/L, preferably 5 to 50 g/L.

The pH of the electroless plating bath at this stage is preferably in the range of 4 to 14.

The electroless plating reaction begins swiftly upon addition of the polymer base particle slurry. This reaction is attended by generation of hydrogen gas, and it is decided that the electroless plating reaction is finished at the time when the generation of hydrogen gas has completely disappeared.

Further, subsequent to the above step, required amounts of aqueous solutions of the nickel salt, sodium hypophosphite, and sodium hydroxide constituting the electroless plating liquid may be added in at least two liquid portions, simultaneously, or successively, preferably continuously, and in a predetermined amount ratio.

The plating reaction resumes upon addition of the electroless plating liquid, and, by regulating the addition amount, the nickel film being formed can be controlled to have a desired thickness. After the addition of the whole amount of the electroless plating liquid is finished and after the generation of hydrogen gas has completely disappeared, stirring is continued while keeping the liquid temperature for some time, to complete the reaction.

While the nickel film is formed on the polymer base particles by the above-described steps, the surfaces of the nickel-plated particles may be further plated with other metal, whereby a multilayer film better in conduction performance can be formed.

For example, in the case of forming a gold film, an electroless plating bath which contains a complexing agent such as EDTA-4Na, citric acid-2Na, etc. and potassium gold cyanide and which has a pH regulated into a weak acidic region by use of an aqueous sodium hydroxide solution is warmed, and the nickel-plated particles are added to the electroless plating bath with stirring, to obtain a dispersed suspension. Thereafter, a mixed aqueous solution of potassium gold cyanide, EDTA-4Na and citric acid-2Na and a mixed aqueous solution of potassium borohydride and sodium hydroxide are individually added to the dispersed suspension, to effect a plating reaction. Thereafter, a post-treatment is conducted by the usual method, whereby conductive particles provided with a multilayer film can be obtained.

The thickness of the conductive film formed by the electroless plating treatment is preferably 0.01 to 1.0 μm, more preferably 0.05 to 0.5 μm, and most preferably 0.08 to 0.2 μm. When the thickness of the plating film is less than 0.01 μm, the film layer may lack uniformity and may be poor in conduction performance. When the thickness exceeds 1.0 μm, on the other hand, the particles may aggregate together during the plating step to show a bridging phenomenon, thereby spoiling dispersibility.

Particularly, in the case where the polymer base particles each include a core particle and a polymer coat layer, it is preferable to regulate the amount of plating so that the thickness (D) of the polymer coat layer and the thickness (E) of the plating film satisfy the following relationship:

$$0.05 \times (E) < (D) < 10 \times (E).$$

With this relationship satisfied, it is possible to obtain conductive particles with such a good balance that the characteristic features of the core particles and the characteristic features of the conductive layer can be exhibited sufficiently.

A more preferable relationship is:

$$0.1 \times (E) < (D) < 5 \times (E).$$

The conductive particles according to an embodiment of the present invention have a specified 50% K value and a specified compressive recovery factor as above-mentioned. Therefore, where the conductive particles are used as a conductive material, the particles are prevented from damaging or penetrating a substrate used for connection between electrodes. In addition, even when the conductive particles undergo high compressive deformation, a high-accuracy gap retention property and a stable connection reliability can be obtained.

Furthermore, where the polymer base particles each include a core particle and a polymer coat layer, the polymer coat layer enhances the acid resistance or alkali resistance of the particles, erosion of the base particles by an acid or alkali can be prevented from occurring. Therefore, exfoliation or cracking of the plating layer attendant on erosion can be prevented, and the physical properties of the core particles can be maintained without being spoiled. This effect is further enhanced in the case where the core particles contain a cross-linking component in a large amount.

The conductive particles according to an embodiment of the present invention as above-described can be dispersed in a thermosetting resin or thermoplastic resin to thereby obtain a resin composition.

When the resin composition is kneaded to obtain a pasty form or a sheet-like form or the like, the resin composition can be used as a conductive material, for example, a conductive adhesive such as a micro device mounting conductive adhesive, an anisotropic conductive adhesive, etc., an anisotropic conductive film or a conductive connecting structure, molded articles of the conductive material, or as a heat-conducting or heat-radiating member, or the like. Particularly, the conductive particles of an embodiment of the present invention can be preferably used as conductive particles for an anisotropic conductive adhesive.

Here, the anisotropic conductive adhesive means an adhesive used for adhering wiring substrates provided thereon with a wiring pattern to each other, with the wiring patterns facing each other, in such a manner that electrical conduction is secured between the wiring patterns facing each other and, simultaneously, insulation is maintained between portions of the wiring pattern on the same substrate.

The anisotropic conductive adhesive has the conductive particles dispersed in an insulating adhesive component.

The anisotropic conductive adhesive may be said to be a kind of pressure-sensitive adhesive, in view of the function for adhering two substrates to each other under pressing. However, the anisotropic conductive adhesive is required to have other characteristics than those required of general pressure-sensitive adhesives in that the anisotropic conductive adhesive as a whole has an insulating property and the components therein are so blended as to show electrical conductivity only in the pressing direction upon adhesion under heating and pressing.

As a general pressure-sensitive adhesive, for example, JP-A 5-17736 discloses a reactive hot melt type adhesive which includes a polystyrene macromer, an alkyl (meth)acrylate, a polyol, a polyisocyanate and a tackifier resin. In the case of such a pressure-sensitive adhesive, the adhesive strength (bond strength) is the most important characteristic. On the other hand, an anisotropic conductive adhesive is required to have not only a high adhesive strength, like those required of the pressure-sensitive adhesives, but also an extremely special characteristic of showing, upon adhesion, conductivity in only a fixed direction at desired positions while showing an insulating property in the other directions.

The anisotropic conductivity of the anisotropic conductive adhesive is exhibited as follows. When two wiring substrates with the anisotropic conductive adhesive therebetween are heated and pressed, the insulating adhesive in the areas of the wiring patterns is moved in transverse directions to maintain the insulating property between portions of the wiring pattern on the same substrate while adhering the substrates to each other, and the wiring patterns disposed respectively on the substrates are put into electrical conduction with each other in only the pressing direction due to the presence of the conductive particles, whereby the substrates are electrically connected to each other.

The insulating adhesive for forming such an anisotropic conductive adhesive functions to adhere two substrates to each other and functions as a dispersant for the conductive particles.

The insulating adhesive component is required to be insulating, to adhere the substrates to each other, and to have such a characteristic that its adhesive strength is not lowered with the lapse of time. In general, a thermosetting type adhesive is used as the insulating adhesive component. Examples of the thermosetting type adhesive include various adhesive resins such as acrylic resins, urethane resins, styrene-butadiene-styrene resins, and styrene-ethylene-butylene-styrene reins.

The insulating adhesive component may be used as it is, or may be admixed further with a thermosetting resin precursor before use.

The thermosetting resin precursor is a component which, when heated at the time of adhesion, can form a thermosetting resin with the insulating adhesive component and other coexisting components. Examples of the thermosetting resin thus formed include phenol resin, urea resin, melamine resin, allyl resin, furan resin, thermosetting polyester resin, epoxy resin, thermosetting silicone resin, thermosetting polyamide resin, polyamide-imide resin, polyimide resin, polyurethane resin, thermosetting fluororesin, and thermosetting polyolefin resin.

In addition, the anisotropic conductive adhesive is admixed with a filler, as required.

Examples of the filler include insulating inorganic particles such as titanium oxide, silicon dioxide, calcium carbonate, calcium phosphate, aluminum oxide, and antimony trioxide, which may be used either singly or in combination. The mean particle diameter of the insulating inorganic particles is normally 0.01 to 5 μm.

The amount of the insulating inorganic particles blended is normally 1.0 to 50.0 parts by weight, preferably 5.0 to 25.0 parts by weight, per 100 parts by weight of the resin component in the adhesive. With the insulating inorganic particles blended in such an amount, the fluidity of the insulating adhesive component can be regulated and, therefore, the insulating adhesive is restrained from flowing back, upon heating after adhesion, to impair the conductive property. In addition, the adhesive can be prevented from flowing out from an end part of the printed substrate at the time of adhesion.

The anisotropic conductive adhesive containing the conductive particles according to an embodiment of the present invention can be prepared by mixing the conductive particles with the above-mentioned adhesive components and optionally with the filler.

The amount of the conductive particles blended is normally 0.5 to 15 parts by weight, preferably 2 to 8 parts by weight, per 100 parts by weight of the insulating adhesive component (resin).

The anisotropic conductive adhesive thus obtained can be used in any of various forms, such as a sheet-like form and a pasty form.

An anisotropic conductive adhesive sheet can be prepared by applying the above-mentioned anisotropic conductive adhesive (composition) by, for example, a knife coater, a comma coater, a reverse coater, a gravure coater or the like, followed by evaporating off the solvent. The thickness of the anisotropic conductive adhesive sheet is normally 1 to 100 μm, preferably 10 to 50 μm.

On the other hand, the pasty anisotropic conductive adhesive can be used in the same manner as above by, for example, applying it to a substrate by use of a screen coater or the like.

Where used as conductive particles for an anisotropic conductive adhesive, the conductive particles according to an embodiment of the present invention may each be provided on the surface thereof with an insulating layer included of an insulating resin. In this case, the thickness of the insulating layer is normally about 0.1 to 0.5 μm. Incidentally, the insulating layer may be coating incompletely the surface of each conductive particle.

The insulating layer is so formed that it coats the surface of each conductive particle (so that the conductive material is not exposed) in the normal condition (natural condition) where no pressure or the like is exerted thereon, but, under heating and pressing at the time of adhering two substrates to each other, the insulating layer is broken to expose the conductive layer.

With such an insulating layer provided, it is possible to achieve connection between micro-circuits while making the most of the characteristics of the conductive particles according to an embodiment of the present invention. In addition, since the conductive particles are each coated with the insulating layer, oxidative deterioration of the particles can be prevented, so that a connecting member with an enhanced long-term connection reliability can be obtained.

The insulating layer is formed from, for example, a resin which is stable with regard to the solvent dissolving or dispersing the insulating adhesive component therein and with regard to the adhesive component.

Examples of such a resin include phenol resin, urea resin, melamine resin, allyl resin, furan resin, polyester resin, epoxy resin, silicone resin, polyamide-imide resin, polyimide resin, polyurethane resin, fluororesin, carbodiimide resin, polyolefin resins (polyethylene, polypropylene, polybutylene, etc.), polyalkyl (meth)acrylate resins, poly(meth)acrylic acid resin, polystyrene resin, acrylonitrile-styrene-butadiene resin, vinyl resin, polyamide resin, polycarbonate resin, polyacetal resin, ionomer resin, polyether sulfone resin, polyphenyl oxide resin, polysulfone resin, polyvinylidene fluoride resin, ethyl cellulose, and cellulose acetate.

Examples of the method of forming the insulating layer on the surface of the conductive layer include chemical methods such as coacervation method, interfacial polymerization method, in situ polymerization method, in-liquid curing coating method, etc.; physical mechanical methods such as spray drying method, in-gas suspension coating method, vacuum vapor deposition coating method, dry blending method, electrostatic uniting method, melt dispersion cooling method, inorganic encapsulation method, etc.; and physical chemical methods such as interfacial precipitation method, etc. Among these methods, preferred are the physical mechanical methods, and particularly preferred is the dry blending method (inclusive of a coating method using a hybridization system).

EXAMPLES

Now, the present invention will be described more specifically below by way of Synthesis Examples, Examples and Comparative Examples, which are not to be construed as limitative of the invention.

[1] Preparation of Polymer Base Particles

Synthesis Example 1

A 5-L separable flask was charged collectively with the compounds set forth in the following Group $A_1$. After replacement of dissolved oxygen with nitrogen, heating and stirring were conducted for about 6 hours by using a stirrer under a stream of nitrogen at an oil bath temperature of 82° C., to obtain a solution of DVB-methacrylic acid-diacrylate copolymer particles.

The particle-containing solution thus obtained was subjected about 3 to 5 times to washing with tetrahydrofuran (hereinafter referred to as THF) and filtration by use of a known suction filtration equipment, followed by vacuum drying, to obtain Core Particles 1. The particle diameter of the particles thus obtained was observed and measured under an SEM. The particles were spherical particles with a mean particle diameter of 3.78 μm. In addition, the Cv value was 3.7%.

| [Group A₁] | |
|---|---|
| DVB | 55.75 g |
| (purity 96%; DVB-960, produced by Nippon Steel Chemical Co., Ltd.) [containing 3% of ethylvinylbenzene] | |
| Methacrylic acid | 37.17 g |
| NK-Ester A-DOD | 92.92 g |
| (produced by Shin-Nakamura Chemical Co., Ltd.) [1,10-decanediol diacrylate] | |
| Acetonitrile | 1728.72 g |
| Azobisisobutyronitrile (hereinafter AIBN) | 16.73 g |
| n-Dodecane | 86.44 g |
| Diethylene glycol monoethyl ether acetate | 84.31 g |
| Dimethylforamide (hereinafter DMF) | 31.44 g |

Next, a 300-ml flask was charged collectively with the compounds set forth in the following Group $B_1$. After ultrasonic dispersion, heating and stirring were conducted for about 2 hours by use of a stirrer under a stream of nitrogen at an oil bath temperature of 50° C., to form a polystyrene coat layer (polymer coat layer) on the surface of each of Core Particles 1.

The solution containing the particles thus obtained was subjected about 3 to 5 times to washing with methanol and filtration by use of a known suction filtration equipment, followed by vacuum drying, to obtain Polymer Base Particles 1. The particle diameter of the particles thus obtained was observed and measured under an SEM. The particles were spherical particles with a mean particle diameter of 3.84 μm. In addition, the Cv value was 3.8%. An SEM photograph of Polymer Base Particles 1 thus obtained is shown in FIG. 1.

| [Group B₁] | |
|---|---|
| Core Particles 1 | 50 g |
| Water (ion-exchanged water) | 18.57 g |
| Methanol | 65 g |
| THF | 9.29 g |
| Styrene | 5 g |
| Ammonium persulfate | 0.25 g |

Synthesis Example 2

In the same manner as in Synthesis Example 1 except that the compounds set forth in the following Group $A_2$ were used, Core Particles 2 composed of a DVB-methacrylic acid-diacrylate copolymer were obtained.

The particle diameter of the particles thus obtained was observed and measured under an SEM. The particles were spherical particles with a mean particle diameter of 5.12 μm. Besides, the Cv value was 4.0%.

| [Group A₂] | |
|---|---|
| DVB (DVB-960) | 61.31 g |
| Methacrylic acid | 40.88 g |
| NK-Ester A-DOD | 102.19 g |
| Acetonitrile | 1858.05 g |
| AIBN | 18.42 g |
| n-Dodecane | 85.51 g |
| Diethylene glycol monoethyl ether acetate | 92.9 g |
| DMF | 31.59 g |

Next, in the same manner as in Synthesis Example 1 except that the compounds set forth in the following Group $B_2$ were used, a coat layer (polymer coat layer) of a styrene-methyl methacrylate copolymer was formed on the surface of each of Core Particles 2, to obtain Polymer Base Particles 2.

The particle diameter of the particles thus obtained was observed and measured under an SEM. The particles were spherical particles with a mean particle diameter of 5.18 μm. In addition, the Cv value was 4.1%.

| [Group B₂] | |
|---|---|
| Core Particles 2 | 50 g |
| Water (ion-exchanged water) | 29.17 g |
| Methanol | 50 g |
| THF | 4.17 g |
| Styrene | 4 g |
| Methyl methacrylate | 1 g |
| Ammonium persulfate | 0.25 g |

Synthesis Example 3

In the same manner as in Synthesis Example 1 except that the compounds set forth in the following Group $A_3$ were used, Core Particles 3 composed of a DVB-methacrylic acid-dimethacrylate copolymer were obtained.

The particle diameter of the particles thus obtained was observed and measured under an SEM. The particles were spherical particles with a mean particle diameter of 4.20 μm. Besides, the Cv value was 3.8%.

| [Group A₃] | |
|---|---|
| DVB (DVB-960) | 51.45 g |
| Methacrylic acid | 51.45 g |
| NK-Ester DOD-N | 68.6 g |
| (produced by Shin-Nakamura Chemical Co., Ltd.) [1,10-decanediol dimethacrylate] | |
| Acetonitrile | 1715 g |
| AIBN | 14.7 g |
| n-Dodecane | 78.4 g |
| Diethylene glycol monoethyl ether acetate | 85.75 g |

Next, in the same manner as in Synthesis Example 1 except that the compounds set forth in the following Group $B_3$ were used, a polystyrene coat layer (polymer coat layer) was formed on the surface of each of Core Particles 3, to obtain Polymer Base Particles 3.

The particle diameter of the particles thus obtained was observed and measured under an SEM. The particles were spherical particles with a mean particle diameter of 4.40 μm. In addition, the Cv value was 3.8%.

| [Group B₃] | |
|---|---|
| Core Particles 3 | 50 g |
| Water (ion-exchanged water) | 23.22 g |
| Methanol | 69.65 g |
| Styrene | 10 g |
| Ammonium persulfate | 0.2 g |
| Polyvinyl pyrrolidone (K-30) | 5 g |

Synthesis Example 4

A 300-ml flask was charged collectively with the compounds set forth in the following Group $B_4$. After ultrasonic dispersion, heating and stirring were conducted for about 4 hours by use of a stirrer under a stream of nitrogen at an oil bath temperature of 50° C., to form a coat layer (polymer coat layer) of a styrene-methacrylic acid copolymer on the surface of each of Core Particles 1.

| [Group B₄] | |
|---|---|
| Core Particles 1 | 50 g |
| Water (ion-exchanged water) | 35 g |
| Methanol | 81.7 g |
| Styrene | 3.5 g |
| Methacrylic acid | 1.5 g |
| Ammonium persulfate | 0.15 g |

Next, 50.18 g of a solution of a carbodiimide resin obtained in the following Reference Synthesis Example 1 and 15.05 g of diethylene glycol monoethyl ether acetate were added to the particle-containing solution, and the reaction was accelerated by heating at an oil bath temperature of 80° C. for 4 hours, and further at 120° C. for 3 hours.

After cooling, the particle-containing solution was subjected about 3 to 5 times to washing with THF and filtration, followed by vacuum drying, to obtain Polymer Base Particles 4.

The particle diameter of the particles thus obtained was observed and measured under an SEM. The particles were spherical particles with a mean particle diameter of 3.9 μm. In addition, the Cv value was 3.8%.

Reference Synthesis Example 1

Synthesis of Carbodiimide Resin

After 300 g of 2,6-tolylene diisocyanate (TDI) and 551.52 g of polypropylene glycol diol type (MW 400) were put into an initial reaction at 100° C. for 2 hours, 41.01 g of phenyl isocyanate and 3.45 g of a carbodiimidization catalyst were added to the reaction system, and reaction was effected at 120° C. for 2 hours, to obtain a terminated carbodiimide resin (average degree of polymerization=3). To this, 1304.7 g of tetrahydrofuran was added slowly, to obtain a urethane-modified carbodiimide resin solution (resin concentration: 40 wt %). Incidentally, when this resin was analyzed by a Fourier transform infrared spectrophotometer (FT-IR8200PC, produced by Shimadzu Corporation), an absorption peak due to the carbodiimide group around a wavelength of 2150 (1/cm) and a peak due to the urethane linkage in a wavelength region of 1600-1750 were recognized.

Synthesis Example 5

A 5-L separable flask was charged collectively with the compounds set forth in Group $A_1$ in Synthesis Example 1 above in the same amounts as in Synthesis Example 1. After replacement of dissolved oxygen with nitrogen, heating and stirring were conducted for about 6 hours by use of a stirrer under a stream of nitrogen at an oil bath temperature of 82° C.

Next, this solution was diluted by adding 1422.32 g of THF thereto, then 14.87 g of styrene was added thereto, and heating and stirring were further conducted at 50° C. for 18 hours, to obtain a copolymer particle-containing solution in which DVB-methacrylic acid-diacrylate copolymer particles coated with polystyrene were contained.

The particle-containing solution thus obtained was subjected about 3 to 5 times to washing with THF and filtration by use of a known suction filtration equipment, followed by vacuum drying, to obtain Core Particles 5.

The particle diameter of the particles thus obtained was observed and measured under an SEM. The particles were spherical particles with a mean particle diameter of 3.80 μm, and the thickness of the polystyrene coat layer was 0.01 μm. Besides, the Cv value was 3.7%.

Next, in the same manner as in Synthesis Example 1 except that the compound set forth in the following Group $B_5$ were used, a styrene-methyl methacrylate copolymer coat layer (polymer coat layer) was formed on the surface of each of Core Particles 5, to obtain Polymer Base Particles 5.

The particle diameter of the particles thus obtained was observed and measured under an SEM. The particles were spherical particles with a mean particle diameter of 3.86 μm. In addition, the Cv value was 3.8%.

| [Group B₅] | |
|---|---|
| Core Particles 5 | 50 g |
| Water (ion-exchanged water) | 27.86 g |
| Methanol | 83.57 g |
| THF | 9.29 g |
| Styrene | 4.50 g |
| Methyl methacrylate | 0.50 g |
| Ammonium persulfate | 0.25 g |

Synthesis Example 6

A 300-ml flask was charged collectively with the compounds set forth in the following Group $B_6$. After ultrasonic dispersion, heating and stirring were conducted for about 2 hours by use of a stirrer under a stream of nitrogen at an oil bath temperature of 50° C., whereby a styrene-methyl methacrylate-DVB copolymer coat layer (polymer coat layer) was formed on the surface of each of Core Particles 3, to obtain Polymer Base Particles 6.

The particle diameter of the particles thus obtained was observed and measured under an SEM. The particles were spherical particles with a mean particle diameter of 4.40 μm. Besides, the Cv value was 3.9%.

| [Group B₆] | |
|---|---|
| Core Particles 3 | 50 g |
| Water (ion-exchanged water) | 18.57 g |
| Methanol | 60.36 g |
| THF | 13.93 g |
| Styrene | 4.65 g |
| DVB (DVB-960) | 0.1 g |
| Methyl methacrylate | 0.25 g |
| Ammonium persulfate | 0.25 g |

Synthesis Example 7

A 300-ml flask was charged collectively with the compounds set forth in the following Group $B_7$. After ultrasonic dispersion, heating and stirring were conducted for about 4 hours by use of a stirrer under a stream of nitrogen at an oil bath temperature of 50° C., to form a DVB coat layer (polymer coat layer) on the surface of each of Core Particles 1.

After cooling, the particle-containing solution was subjected about 3 to 5 times to washing with THF and filtration, followed by vacuum drying, to obtain Polymer Base Particles 7.

The particle diameter of the particles thus obtained was observed and measured under an SEM. The particles were spherical particles with a mean particle diameter of 3.82 μm and a Cv value of 3.8%.

| [Group B₇] | |
|---|---|
| Core Particles 1 | 20 g |
| Water (ion-exchanged water) | 5.67 g |
| Methanol | 56.67 g |
| THF | 51.0 g |
| DVB (DVB-960) | 1.5 g |
| Ammonium persulfate | 0.075 g |

Synthesis Example 8

A 300-ml flask was charged collectively with the compounds set forth in the following Group B₈. After ultrasonic dispersion, heating was conducted by use of a stirrer under a stream of nitrogen at an oil bath temperature of 80° C. for about 6 hours and, further, at 150° C. for about 2 hours, whereby a cross-linking reaction owing to the carbodiimide group was accelerated, to form a surface cross-linked coat layer of a carbodiimide resin on the surface of each of Core Particles 1.

After cooling, the particle-containing solution was subjected about 3 to 5 times to washing with THF and filtration, followed by vacuum drying, to obtain Polymer Base Particles 8.

The particle diameter of the particles thus obtained was observed and measured under an SEM. The particles were spherical particles with a mean particle diameter of 3.82 µm. In addition, the Cv value was 3.9%.

Incidentally, when the particles were analyzed by a Fourier transform infrared spectrophotometer (FT-IR8200PC, produced by Shimadzu Corporation), an absorption peak due to the carbodiimide group at a wavelength of around 2150 (1/cm) was recognized, though faintly.

| [Group B₈] | |
|---|---|
| Core Particles 1 | 12.5 g |
| Diethylene glycol monoethyl ether acetate | 112.5 g |
| 2,6-tolylene diisocyanate (TDI) | 6.25 g |
| Carbodiimidization catalyst | 0.0625 g |

Synthesis Example 9 (Comparative)

A 5-L flask was charged collectively with a mixture obtained by mixing the compounds set forth in the following Group A₉ in the ratio given below. After replacement of dissolved oxygen with nitrogen, heating and stirring were conducted for about 10 hours by use of a stirrer under a stream of nitrogen at an oil bath temperature of 80° C., to obtain a solution containing polystyrene particles.

Next, the particle-containing solution was subjected about 3 to 5 times to washing with methanol and filtration by use of a known suction filtration equipment, followed by vacuum drying, to obtain Polymer Base Particles 9. The particle diameter of the particles thus obtained was observed and measured under an SEM. The particles were spherical particles with a mean particle diameter of 3.80 µm and a Cv value of 4.0%. Incidentally, the particles were dissolved when washed with THF.

| [Group A₉] | |
|---|---|
| Styrene | 516.0 g |
| Methanol | 828.0 g |
| Ethanol | 552.0 g |
| AIBN | 39.0 g |
| Polyvinyl pyrrolidone (K-30) | 210.0 g |

Synthesis Example 10 (Comparative)

A 2-L beaker was charged with the compounds set forth in the following Group A₁₀ in the ratio given below, followed by mixing. The mixture was stirred at room temperature at a stirring rate of 10000 rpm for 30 minutes by use of a homogenizer (ULTRA TURRAX T18 Basic, produced by IKA WORKS), to obtain a suspension.

Next, the suspension was transferred into a 2-L separable flask, and heating and stirring were conducted for about 6 hours by use of a stirrer under a stream of nitrogen at an oil bath temperature of 70° C., to obtain a solution containing styrene-DVB copolymer particles. Thereafter, classification, washing and filtration were repeated, followed by vacuum drying, to obtain Polymer Base Particles 10. The particle diameter of the particles thus obtained was observed and measured under an SEM. The particles were spherical particles with a mean particle diameter of 3.40 µm. In addition, the Cv value was 4.7%.

| [Group A₁₀] | |
|---|---|
| Styrene | 40.8 g |
| DVB (DVB-960) | 17.5 g |
| Water | 766.95 g |
| AIBN | 1.5 g |
| Polyvinyl pyrrolidone (K-30) | 12.4 g |

Synthesis Example 11 (Comparative)

Corresponding to Example in JP-B 7-95165

A 2-L beaker was charged with the compounds set forth in the following Group A₁₁ in the ratio given below, followed by mixing. The mixture was stirred at room temperature at a stirring rate of 10000 rpm for 30 minutes by use of a homogenizer (ULTRA TURRAY T18 Basic, produced by IKA WORKS), to obtain a suspension.

Next, the suspension was transferred into a 2-L separable flask, and heating and stirring were conducted for about 6 hours by use of a stirrer under a stream of nitrogen at an oil bath temperature of 70° C., to obtain a solution containing tetramethylolmethane tetraacrylate-DVB copolymer particles. Thereafter, classification, washing and filtration were repeated, followed by vacuum drying, to obtain Polymer Base Particles 11. The particle diameter of the particles thus obtained was observed and measured under an SEM. The particles were spherical particles with a mean particle diameter of 3.95 µm. In addition, the Cv value was 5.2%.

| [Group A₁₁] | |
|---|---|
| Tetramethylolmethane tetraacrylate (25) | 31.3 g |
| DVB (DVB-960) (75) | 93.8 g |
| Water | 1156.3 g |

-continued

| [Group A₁₁] | |
|---|---|
| Benzoyl peroxide | 2.48 g |
| Polyvinyl alcohol | 93.8 g |

Synthesis Example 12 (Comparative)

Corresponding to Example in JP-A 1-144429

A 2-L beaker was charged with the compounds set forth in the following Group $A_{12}$ in the ratio given below, followed by mixing. The mixture was stirred at room temperature at a stirring rate of 10000 rpm for 30 min by use of a homogenizer (ULTRA TURRAY T18 Basic, produced by IKA WORKS), to obtain a suspension.

Next, the suspension was transferred into a 2-L separable flask, and heating and stirring were conducted for about 10 hours by use of a stirrer under a stream of nitrogen at an oil bath temperature of 80° C., to obtain a solution containing dipentaerythritol hexaacrylate-DVB copolymer particles. Thereafter, classification, washing and filtration were repeated, followed by vacuum drying, to obtain Polymer Base Particles 12. The particle diameter of the particles thus obtained was observed and measured under an SEM. The particles were spherical particles with a mean particle diameter of 4.05 μm. Besides, the Cv value was 4.6%.

| [Group A₁₂] | |
|---|---|
| Dipentaerythritol hexaacrylate (50) | 187.5 g |
| DVB (DVB-960) (50) | 187.5 g |
| Polyvinyl alcohol | 37.5 g |
| Water | 712.5 g |
| Benzoyl peroxide | 5.64 g |

The data on the above-mentioned base particles are given in Table 1 below.

TABLE 1

| | Base particle | Particle diameter (μm) | Cv value (%) | Thickness of coat layer (μm) | Coat layer component |
|---|---|---|---|---|---|
| Synthesis Example 1 | 1 | 3.84 | 3.8 | 0.03 | Polystyrene |
| Synthesis Example 2 | 2 | 5.18 | 4.1 | 0.03 | Styrene-methacrylic resin |
| Synthesis Example 3 | 3 | 4.40 | 3.8 | 0.10 | Polystyrene |
| Synthesis Example 4 | 4 | 3.90 | 3.8 | 0.06 | Carbodiimide cross-linked |
| Synthesis Example 5 | 5 | 3.86 | 3.8 | 0.03 | Styrene-methacrylic resin |
| Synthesis Example 6 | 6 | 4.40 | 3.9 | 0.10 | Styrene-DVB-methacrylic resin |
| Synthesis Example 7 | 7 | 3.82 | 3.8 | 0.02 | DVB cross-linked |
| Synthesis Example 8 | 8 | 3.82 | 3.9 | 0.02 | Carbodiimide cross-linked |
| Synthesis Example 9 | 9 | 3.80 | 4.0 | — | — |
| Synthesis Example 10 | 10 | 3.40 | 4.7 | — | — |
| Synthesis Example 11 | 11 | 3.95 | 5.2 | — | — |
| Synthesis Example 12 | 12 | 4.05 | 4.6 | — | — |

Incidentally, the thickness of the coat layer was obtained from the SEM measurement results by:

[(Mean particle diameter of polymer base particles)– (Mean particle diameter of core particles)]/2.

Base Particle Evaluation Test 1

(Evaluation of Elasticity of Particles)

Polymer Base Particles 1 to 12 obtained in Synthesis Examples above were subjected to evaluation of particle elasticity characteristics (compressibility, recovery factor, K value) by use of a micro-compression testing machine (MCT-W201, produced by Shimadzu Corporation) (measurement temperature: 20° C.).

In addition, the compression displacements of the particles when the compressive load on one particle was 1 gf (9.8 mN) and 1.5 gf (14.7 mN) were also measured, and evaluated (measurement temperature: 20° C.). The results are shown in Tables 2 to 6.

TABLE 2

| | Base particle | Evaluation of elasticity characteristics (Compression displacement: 60%) | | |
|---|---|---|---|---|
| | | Compressibility (%) | Recovery factor (%) | 60% K value (N/mm²) |
| Synthesis Example 1 | 1 | 60.6 | 36.3 | 5264 |
| Synthesis Example 2 | 2 | 60.1 | 34.9 | 3671 |
| Synthesis Example 3 | 3 | 60.3 | 35.0 | 4125 |
| Synthesis Example 4 | 4 | 60.3 | 33.8 | 4932 |
| Synthesis Example 5 | 5 | 60.1 | 36.4 | 5382 |
| Synthesis Example 6 | 6 | 60.5 | 35.2 | 3963 |
| Synthesis Example 7 | 7 | 60.0 | 41.2 | 6104 |
| Synthesis Example 8 | 8 | 60.2 | 39.0 | 5416 |
| Synthesis Example 9 | 9 | 60.1 | 8.8 | 780 |
| Synthesis Example 10 | 10 | Breaking point generated | — | — |
| Synthesis Example 11 | 11 | Breaking point generated | — | — |
| Synthesis Example 12 | 12 | Breaking point generated | — | — |

Incidentally, the recovery factor was measured under such a load as to give a compressibility of more than 60%.

TABLE 3

| | Base particle | Evaluation of elasticity characteristics (Compression displacement: 65%) | | |
|---|---|---|---|---|
| | | Compressibility (%) | Recovery factor (%) | 65% K value (N/mm$^2$) |
| Synthesis Example 1 | 1 | 65.0 | 26.4 | 6051 |
| Synthesis Example 2 | 2 | 65.2 | 24.4 | 4113 |
| Synthesis Example 3 | 3 | 65.4 | 25.2 | 5767 |
| Synthesis Example 4 | 4 | 65.2 | 23.9 | 6231 |
| Synthesis Example 5 | 5 | 65.1 | 26.9 | 6166 |
| Synthesis Example 6 | 6 | 65.2 | 24.8 | 4855 |
| Synthesis Example 7 | 7 | 65.0 | 31.1 | 7010 |
| Synthesis Example 8 | 8 | 65.0 | 29.3 | 6329 |
| Synthesis Example 9 | 9 | 65.1 | 7.1 | 850 |
| Synthesis Example 10 | 10 | Breaking point generated | — | — |
| Synthesis Example 11 | 11 | Breaking point generated | — | — |
| Synthesis Example 12 | 12 | Breaking point generated | — | — |

Incidentally, the recovery factor was measured under such a load as to give a compressibility of more than 65%.

TABLE 4

| | Base particle | Evaluation of elasticity characteristics (Compression displacement: 70%) | | |
|---|---|---|---|---|
| | | Compressibility (%) | Recovery factor (%) | 70% K value (N/mm$^3$) |
| Synthesis Example 1 | 1 | 70.1 | 24.3 | 6725 |
| Synthesis Example 2 | 2 | 70.0 | 22.6 | 4259 |
| Synthesis Example 3 | 3 | 70.2 | 23.0 | 5877 |
| Synthesis Example 4 | 4 | 70.0 | 22.1 | 6506 |
| Synthesis Example 5 | 5 | 70.0 | 25.0 | 6912 |
| Synthesis Example 6 | 6 | 70.3 | 22.8 | 5019 |
| Synthesis Example 7 | 7 | Breaking point generated | — | — |
| Synthesis Example 8 | 8 | Breaking point generated | — | — |
| Synthesis Example 9 | 9 | 70.2 | 6.9 | 1024 |
| Synthesis Example 10 | 10 | Breaking point generated | — | — |
| Synthesis Example 11 | 11 | Breaking point generated | — | — |
| Synthesis Example 12 | 12 | Breaking point generated | — | — |

Incidentally, the recovery factor was measured under such a load as to give a compressibility of more than 70%.

TABLE 5

| | Base particle | Compression displacement at compressive load 1 gf (9.8 mN) |
|---|---|---|
| Synthesis Example 1 | 1 | 56.2 |
| Synthesis Example 2 | 2 | 48.9 |
| Synthesis Example 3 | 3 | 51.2 |
| Synthesis Example 4 | 4 | 54.8 |
| Synthesis Example 5 | 5 | 58.1 |
| Synthesis Example 6 | 6 | 50.6 |
| Synthesis Example 7 | 7 | 51.8 |
| Synthesis Example 8 | 8 | 53.6 |
| Synthesis Example 9 | 9 | 72.6 |
| Synthesis Example 10 | 10 | 21.9 |
| Synthesis Example 11 | 11 | 45.4 |
| Synthesis Example 12 | 12 | 43.6 |

TABLE 6

| | Base particle | Compression displacement at compressive load 1.5 gf (14.7 mN) |
|---|---|---|
| Synthesis Example 1 | 1 | 63.1 |
| Synthesis Example 2 | 2 | 54.6 |
| Synthesis Example 3 | 3 | 58.4 |
| Synthesis Example 4 | 4 | 61.5 |
| Synthesis Example 5 | 5 | 64.9 |
| Synthesis Example 6 | 6 | 57.2 |
| Synthesis Example 7 | 7 | 58.1 |
| Synthesis Example 8 | 8 | 60.4 |
| Synthesis Example 9 | 9 | 76.4 |
| Synthesis Example 10 | 10 | Breaking point generated |
| Synthesis Example 11 | 11 | 49.8 |
| Synthesis Example 12 | 12 | 47.9 |

Base Particle Evaluation Test 2

(Evaluation of Elasticity Upon Softening)

Polymer Base Particles 1 to 12 were subjected to evaluation of particle compressive elastic deformation characteristics ($K_{B20}$, $K_{B30}$) at compression displacements of 20% and 30% by use of a micro-compression testing machine (MCT-W201, produced by Shimadzu Corporation) (measurement temperature: 20° C.). The results are shown in Table 7.

TABLE 7

| | Base particle | $K_{B20}$ (N/mm$^2$) | $K_{B30}$ (N/mm$^2$) | Evaluation |
|---|---|---|---|---|
| Synthesis Example 1 | 1 | 2168 | 1807 | $K_{B20} > K_{B30}$ |
| Synthesis Example 2 | 2 | 1880 | 1670 | $K_{B20} > K_{B30}$ |
| Synthesis Example 3 | 3 | 1895 | 1686 | $K_{B20} > K_{B30}$ |
| Synthesis Example 4 | 4 | 2179 | 1906 | $K_{B20} > K_{B30}$ |
| Synthesis Example 5 | 5 | 2230 | 1880 | $K_{B20} > K_{B30}$ |
| Synthesis Example 6 | 6 | 2011 | 1822 | $K_{B20} > K_{B30}$ |
| Synthesis Example 7 | 7 | 2856 | 2760 | $K_{B20} > K_{B30}$ |
| Synthesis Example 8 | 8 | 2442 | 2356 | $K_{B20} > K_{B30}$ |
| Synthesis Example 9 | 9 | 2633 | 2501 | $K_{B20} > K_{B30}$ |
| Synthesis Example 10 | 10 | 6455 | 7636 | $K_{B20} < K_{B30}$ |
| Synthesis Example 11 | 11 | 3330 | 3691 | $K_{B20} < K_{B30}$ |
| Synthesis Example 12 | 12 | 3207 | 3416 | $K_{B20} < K_{B30}$ |

Base Particle Evaluation Test 3

(Evaluation of Surface Properties of Base Particles)

Polymer Base Particles 1 to 12 and corresponding Core Particles were subjected to measurement of compressive elastic deformation characteristics $K_{B10}$ and $K_{C10}$ at a compression displacement of 10% by use of a micro-compression testing machine (MCT-W201, produced by Shimadzu Corporation). The results are shown in Table B.

TABLE 8

| | Base particle | Core particle 10% K value $K_{C10}$ (N/mm$^2$) | Base particle 10% K value $K_{B10}$ (N/mm$^2$) | Evaluation 1 |
|---|---|---|---|---|
| Synthesis Example 1 | 1 | 3611 | 3423 | $K_{C10} > K_{B10}$ |
| Synthesis Example 2 | 2 | 2425 | 2288 | $K_{C10} > K_{B10}$ |
| Synthesis Example 3 | 3 | 3092 | 2901 | $K_{C10} > K_{B10}$ |
| Synthesis Example 4 | 4 | 3512 | 3295 | $K_{C10} > K_{B10}$ |
| Synthesis Example 5 | 5 | 3624 | 3506 | $K_{C10} > K_{B10}$ |
| Synthesis Example 6 | 6 | 3199 | 3063 | $K_{C10} > K_{B10}$ |
| Synthesis Example 7 | 7 | 4062 | 4241 | $K_{C10} < K_{B10}$ |
| Synthesis Example 8 | 8 | 3784 | 3902 | $K_{C10} < K_{B10}$ |
| Synthesis Example 9 | 9 | — | 1751 | No coat |
| Synthesis Example 10 | 10 | — | 8326 | No coat |
| Synthesis Example 11 | 11 | — | 4111 | No coat |
| Synthesis Example 12 | 12 | — | 4053 | No coat |

[2] Preparation of Conductive Particles
(Nickel-Gold Conductive Layer)

Example 1

According to the method described in JP-A 62-30885, Polymer Base Particles 1 as a core material were washed, were modified in the surfaces thereof, then the surfaces of the Base Particles 1 were activated, palladium was supported on the activated particle surfaces, and a nickel film was formed on the surfaces of Polymer Base Particles 1 by use of an aqueous nickel sulfate solution, an aqueous citric acid solution, an aqueous sodium hypophosphite solution, and an aqueous sodium hydroxide solution as a pH regulator.

Subsequently, the particles provided with the nickel film thereon were plated with gold by use of an aqueous solution containing EDTA-4Na, citric acid-2Na and potassium gold cyanide and an aqueous solution of sodium hydroxide, to obtain Conductive Particles 1 each having a nickel-gold conductive layer on the surface of Polymer Base Particle 1.

Figure 2:
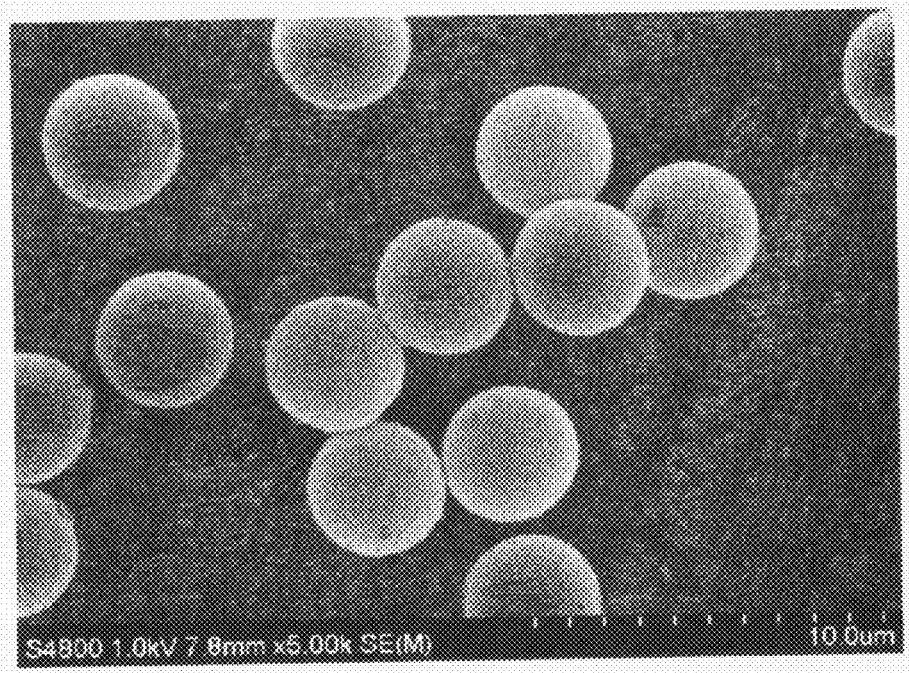
FIG. 2 is an SEM photograph of conductive particles.
Figure 3:
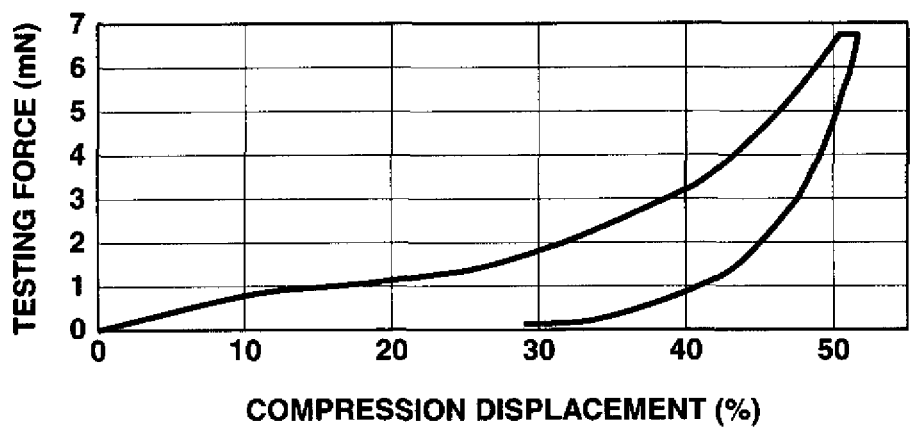
FIG. 3 is a graph showing the results of a loading-unloading test (compression displacement: 50%) of conductive particles of Example 1.
Figure 4:
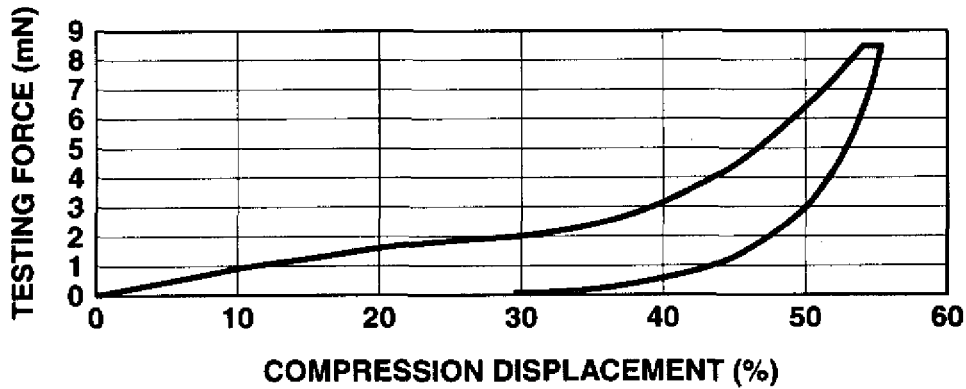
FIG. 4 is a graph showing the results of a loading-unloading test (compression displacement; 55%) of the conductive particles of Example 1.
Figure 5:
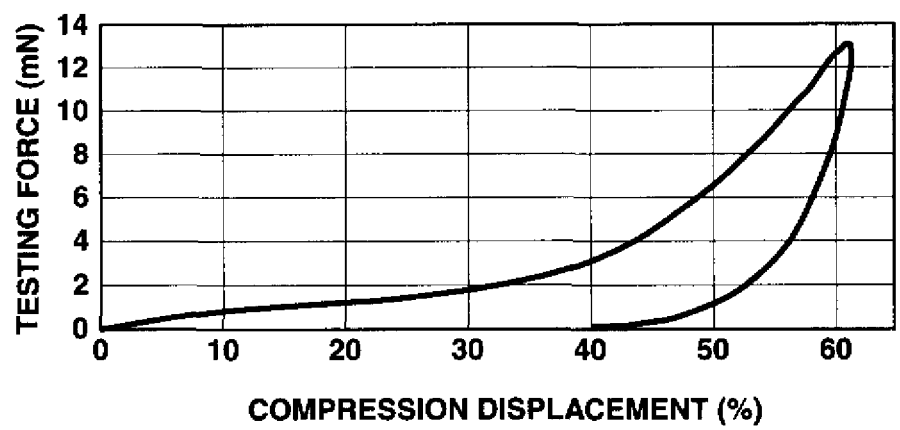
FIG. 5 is a graph showing the results of a loading-unloading test (compression displacement: 60%) of the conductive particles of Example 1.
Figure 6:
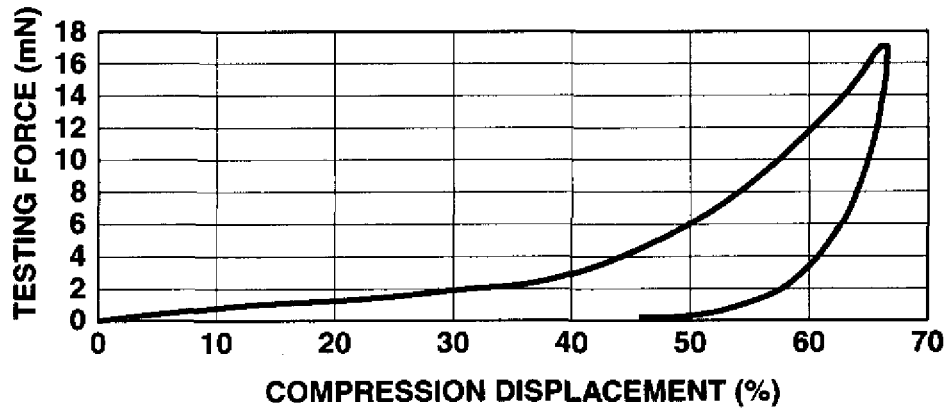
FIG. 6 is a graph showing the results of a loading-unloading test (compression displacement: 65%) of the conductive particles of Example 1.
Figure 7:
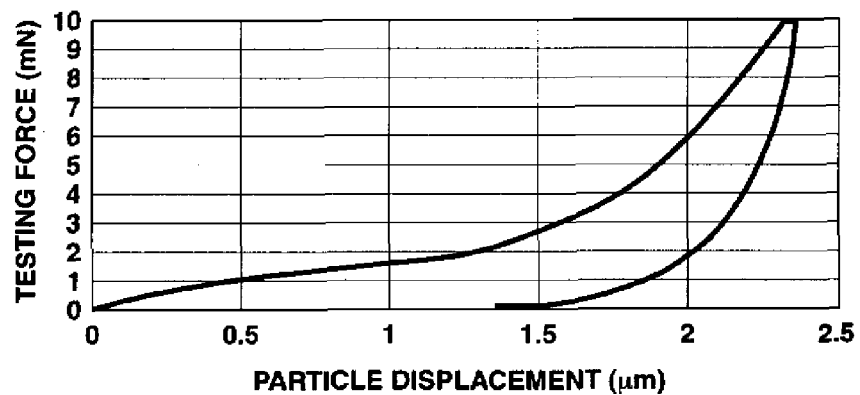
FIG. 7 is a graph showing the results of a loading-unloading test [1 gf (9.8 mN) loading] of the conductive particles of Example 1.
Figure 8:
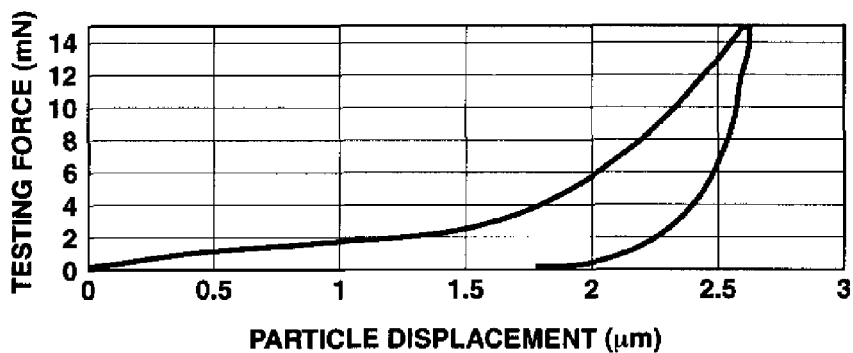
FIG. 8 is a graph showing the results of a loading-unloading test [1.5 gf (14.7 mN) loading] of the conductive particles of Example 1.
Figure 9:
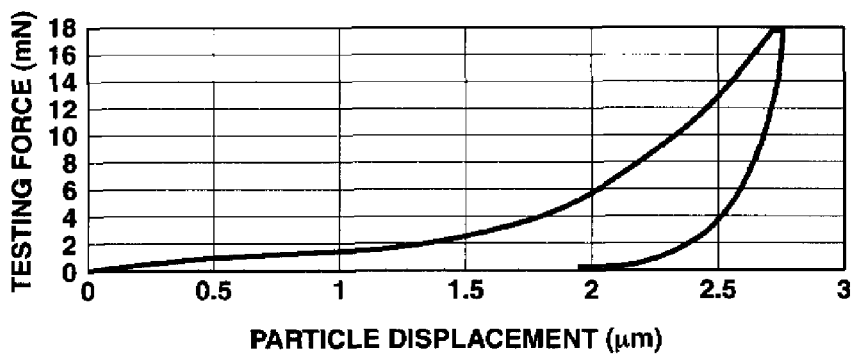
FIG. 9 is a graph showing the results of a loading-unloading test [1.8 gf (17.6 mN) loading] of the conductive particles of Example 1.
Figure 10:
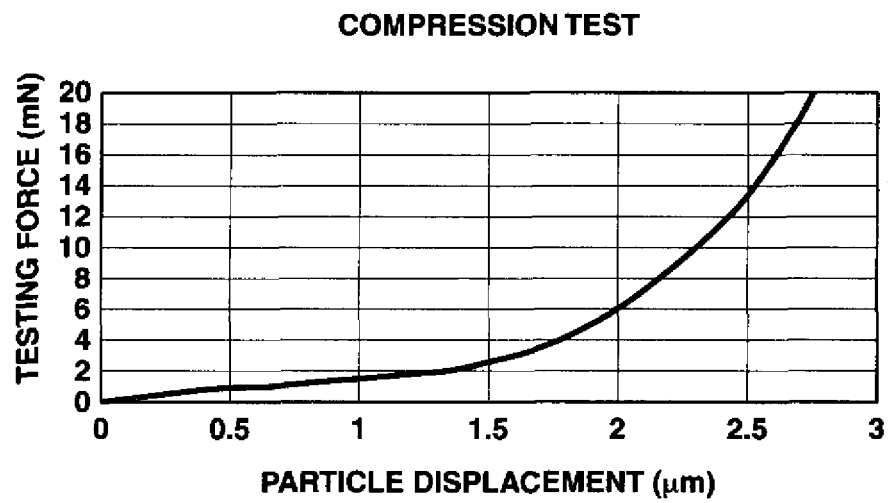
FIG. 10 is a graph showing the results of a compressive load-particle displacement test of the conductive particles of Example 1.

The particle diameter of Conductive Particles 1 thus obtained was observed and measured under an SEM. The particles were spherical particles with a mean particle diameter of 3.90 µm. In addition, the Cv value was 3.8%. An SEM photograph of Conductive Particles 1 is shown in FIG. 2.

Examples 2 to 8

In the same manner as in Example 1 except for using Polymer Base Particles 2 to 8, Conductive Particles 2 to 8 having a nickel-gold conductive layer were obtained.

Example 9

In the same manner as in Example 1 except for using Core Particles 1, Conductive Particles 9 having a nickel-gold conductive layer were obtained.

Example 10

In the same manner as in Example 1 except for using Core Particles 3, Conductive Particles 10 having a nickel-gold conductive layer were obtained.

Comparative Examples 1 to 4

In the same manner as in Example 1 except for using Polymer Base Particles 9 to 12, Conductive Particles 11 to 14 having a nickel-gold conductive layer were obtained.

The data on Examples 1 to 10 and Comparative Examples 1 to 4 are collectively shown in Table 9.

TABLE 9

| | Conductive particle | Particle diameter (µm) | Cv value (%) | Plating layer (µm) | Ni layer (µm) | Au layer (µm) |
|---|---|---|---|---|---|---|
| Example 1 | 1 | 4.04 | 3.9 | 0.10 | 0.05 | 0.05 |
| Example 2 | 2 | 5.58 | 4.4 | 0.20 | 0.10 | 0.10 |
| Example 3 | 3 | 4.60 | 4.1 | 0.10 | 0.05 | 0.05 |
| Example 4 | 4 | 4.10 | 4.0 | 0.10 | 0.05 | 0.05 |
| Example 5 | 5 | 4.06 | 3.8 | 0.10 | 0.05 | 0.05 |
| Example 6 | 6 | 4.60 | 4.2 | 0.10 | 0.05 | 0.05 |
| Example 7 | 7 | 4.02 | 4.0 | 0.10 | 0.05 | 0.05 |
| Example 8 | 8 | 4.02 | 4.0 | 0.10 | 0.05 | 0.05 |
| Example 9 | 9 | 3.98 | 3.9 | 0.10 | 0.05 | 0.05 |
| Example 10 | 10 | 4.40 | 3.9 | 0.10 | 0.05 | 0.05 |
| Comparative Example 1 | 11 | 4.00 | 4.4 | 0.10 | 0.05 | 0.05 |
| Comparative Example 2 | 12 | 3.60 | 5.0 | 0.10 | 0.05 | 0.05 |
| Comparative Example 3 | 13 | 4.15 | 5.6 | 0.10 | 0.05 | 0.05 |
| Comparative Example 4 | 14 | 4.25 | 5.1 | 0.10 | 0.05 | 0.05 |

Incidentally, the thickness of the plating layer was obtained from the SEM measurement results by:

[(Mean particle diameter of conductive particles)−(Mean particle diameter of polymer base particles)]/2.

In addition, the thickness of the Ni layer was obtained by:

[(Mean particle diameter of Ni-coated conductive particles)−(Mean particle diameter of polymer base particles)]/2.

Further, the thickness of the Au layer was obtained by:

[(Mean particle diameter of Au-coated conductive particles)−(Mean particle diameter of Ni-coated conductive particles)]/2.

Conductive Particle Evaluation Test 1
(Evaluation of Elasticity of Particles)

The conductive particles obtained respectively in Examples and Comparative Examples were subjected to evaluation of particle elasticity characteristics (compressibility, recovery factor, K value) by use of a micro-compression testing machine (MCT-W201, produced by Shimadzu Corporation) (measurement temperature: 20° C.).

In addition, compression displacements of particles when the compressive load on one particle was 1 gf (9.8 mN), 1.5 gf (14.7 mN) and 1.8 gf (17.6 mN) were also measured, and evaluated (measurement temperature: 20° C.). The results are shown in Tables 10 to 16. Incidentally, FIGS. 3 to 10 show graphs of load-compression displacement and loading-unloading test for the particles obtained in Example 1.

TABLE 10

| | Evaluation of elasticity characteristics (Compression displacement: 50%) | | |
|---|---|---|---|
| | Compressibility (%) | Recovery factor (%) | 50% K value (N/mm$^2$) |
| Example 1 | 50.1 | 48.0 | 3400 |
| Example 2 | 50.0 | 45.4 | 2979 |
| Example 3 | 50.2 | 46.7 | 3150 |
| Example 4 | 50.1 | 45.2 | 3385 |
| Example 5 | 50.0 | 49.3 | 3510 |
| Example 6 | 50.3 | 45.6 | 3299 |
| Example 7 | 50.1 | 55.0 | 4782 |
| Example 8 | 50.1 | 53.5 | 4413 |
| Example 9 | 50.1 | 47.6 | 3721 |
| Example 10 | 50.0 | 46.9 | 3633 |
| Comparative Example 1 | 50.2 | 19.8 | 1793 |
| Comparative Example 2 | Breaking point generated | — | — |
| Comparative Example 3 | Breaking point generated | — | — |
| Comparative Example 4 | Breaking point generated | — | — |

Incidentally, the recovery factor was measured under such a load as to give a compressibility of more than 50%.

TABLE 11

Evaluation of elasticity characteristics
(Compression displacement: 55%)

| | Compressibility (%) | Recovery factor (%) | 55% K value (N/mm²) |
|---|---|---|---|
| Example 1 | 55.1 | 45.1 | 3646 |
| Example 2 | 55.0 | 43.6 | 3619 |
| Example 3 | 55.3 | 44.1 | 3734 |
| Example 4 | 55.2 | 43.2 | 3640 |
| Example 5 | 55.1 | 45.8 | 3721 |
| Example 6 | 55.2 | 42.9 | 4862 |
| Example 7 | 55.1 | 50.6 | 5296 |
| Example 8 | 55.1 | 49.1 | 4362 |
| Example 9 | 55.0 | 45.1 | 3897 |
| Example 10 | 55.2 | 44.4 | 3784 |
| Comparative Example 1 | 55.1 | 15.0 | 1233 |
| Comparative Example 2 | Breaking point generated | — | — |
| Comparative Example 3 | Breaking point generated | — | — |
| Comparative Example 4 | Breaking point generated | — | — |

Incidentally, the recovery factor was measured under such a load as to give a compressibility of more than 55%.

TABLE 12

Evaluation of elasticity characteristics
(Compression displacement: 60%)

| | Compressibility (%) | Recovery factor (%) | 60% K value (N/mm²) |
|---|---|---|---|
| Example 1 | 60.2 | 36.3 | 4890 |
| Example 2 | 60.2 | 34.9 | 4420 |
| Example 3 | 60.1 | 35.7 | 4865 |
| Example 4 | 60.1 | 34.5 | 4872 |
| Example 5 | 60.2 | 37.1 | 4986 |
| Example 6 | 60.3 | 34.2 | 4854 |
| Example 7 | Breaking point generated | — | — |
| Example 8 | Breaking point generated | — | — |
| Example 9 | 60.2 | 36.1 | 4801 |
| Example 10 | 60.3 | 34.1 | 3967 |
| Comparative Example 1 | 60.4 | 10.1 | 1655 |
| Comparative Example 2 | Breaking point generated | — | — |
| Comparative Example 3 | Breaking point generated | — | — |
| Comparative Example 4 | Breaking point generated | — | — |

Incidentally, the recovery factor was measured under such a load as to give a compressibility of more than 60%.

TABLE 13

Evaluation of elasticity characteristics
(Compression displacement: 65%)

| | Compressibility (%) | Recovery factor (%) | 65% K value (N/mm²) |
|---|---|---|---|
| Example 1 | 65.2 | 30.1 | 5802 |
| Example 2 | 65.0 | 28.9 | 5414 |
| Example 3 | 65.1 | 29.6 | 5826 |
| Example 4 | 65.0 | 28.6 | 5782 |
| Example 5 | 65.3 | 30.8 | 5916 |
| Example 6 | 65.1 | 26.4 | 5763 |
| Example 7 | Breaking point generated | — | — |
| Example 8 | Breaking point generated | — | — |
| Example 9 | Breaking point generated | — | — |
| Example 10 | Breaking point generated | — | — |
| Comparative Example 1 | 65.4 | 8.3 | 1964 |
| Comparative Example 2 | Breaking point generated | — | — |
| Comparative Example 3 | Breaking point generated | — | — |
| Comparative Example 4 | Breaking point generated | — | — |

Incidentally, the recovery factor was measured under such a load as to give a compressibility of more than 65*.

TABLE 14

| | Compression displacement at compressive load 1 gf (9.8 mN) | Recovery factor (%) |
|---|---|---|
| Example 1 | 56.6 | 38.9 |
| Example 2 | 49.2 | 36.2 |
| Example 3 | 53.1 | 37.1 |
| Example 4 | 55.9 | 37.5 |
| Example 5 | 57.1 | 40.4 |
| Example 6 | 53.2 | 36.9 |
| Example 7 | 52.2 | 52.6 |
| Example 8 | 53.4 | 51.8 |
| Example 9 | 56.3 | 31.1 |
| Example 10 | 54.8 | 30.2 |
| Comparative Example 1 | 73.3 | 10.4 |
| Comparative Example 2 | Breaking point generated | — |
| Comparative Example 3 | Breaking point generated | — |
| Comparative Example 4 | Breaking point generated | — |

TABLE 15

| | Compression displacement at compressive load 1.5 gf (14.7 mN) | Recovery factor (%) |
|---|---|---|
| Example 1 | 62.7 | 32.4 |
| Example 2 | 54.6 | 30.2 |
| Example 3 | 57.2 | 31 |
| Example 4 | 61.2 | 31.3 |
| Example 5 | 63.3 | 33.7 |
| Example 6 | 56.5 | 30.8 |
| Example 7 | 57.1 | 45.3 |
| Example 8 | 58.6 | 42.6 |
| Example 9 | Breaking point generated | — |
| Example 10 | Breaking point generated | — |
| Comparative Example 1 | 79.4 | 8.7 |
| Comparative Example 2 | Breaking point generated | — |
| Comparative Example 3 | Breaking point generated | — |
| Comparative Example 4 | Breaking point generated | — |

TABLE 16

| | Compression displacement at compressive load 1.8 gf (17.6 mN) | Recovery factor (%) |
|---|---|---|
| Example 1 | 65.6 | 28.5 |
| Example 2 | 57.2 | 26.7 |
| Example 3 | 62.5 | 27.5 |
| Example 4 | 65.1 | 27.6 |
| Example 5 | 66.3 | 29.7 |
| Example 6 | 63.5 | 27 |
| Example 7 | Breaking point generated | — |
| Example 8 | Breaking point generated | — |
| Example 9 | Breaking point generated | — |
| Example 10 | Breaking point generated | — |
| Comparative Example 1 | 83.2 | 7.4 |
| Comparative Example 2 | Breaking point generated | — |
| Comparative Example 3 | Breaking point generated | — |
| Comparative Example 4 | Breaking point generated | — |

Conductive Particle Evaluation Test 2

(Evaluation of Softness)

The particles obtained respectively in Examples 1 to 10 and Comparative Examples 1 to 4 were subjected to evaluation of particle compressive elastic deformation characteristics ($K_{20}$, $K_{30}$) at compression displacements of 10%, 20%, and 30% by use of a micro-compression testing machine (MCT-W201, produced by Shimadzu Corporation).

In addition, the relationship between particle compressive elastic deformation characteristic and compression displacement was represented by a graph, the point on the graph corresponding to the compressive elastic deformation characteristic $K_{10}$ (10% K value) was taken as a reference point, a straight line passing through the reference point and being orthogonal to the compressive elastic deformation characteristic axis is drawn, and the compression displacement P (%) at the other intersection ($K_P$ point) of the straight line with the graph than the reference point was evaluated. The results are given in Table 17.

Figure 11:
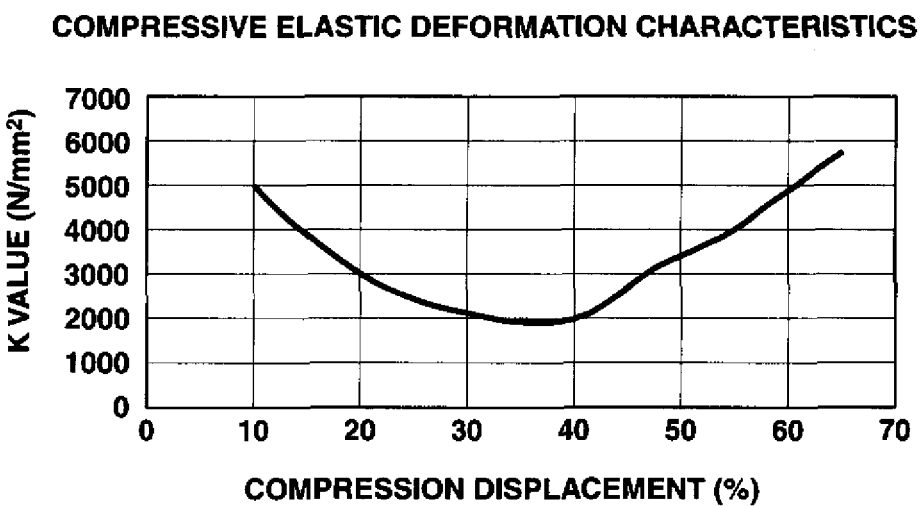
FIG. 11 is a graph showing the results of a particle compressive elastic deformation characteristic (K value)-compression displacement test of the conductive particles of Example 1.

Incidentally, FIG. 11 shows a graph of particle compressive elastic deformation characteristic-compression displacement for the particles obtained in Example 1.

TABLE 17

| | $K_{10}$ (N/mm²) | $K_{20}$ (N/mm²) | $K_{30}$ (N/mm²) | Evaluation | Compression displacement P (%) |
|---|---|---|---|---|---|
| Example 1 | 5010 | 2944 | 2076 | $K_{20} > K_{30}$ | 62.2 |
| Example 2 | 3327 | 2089 | 1793 | $K_{20} > K_{30}$ | 53.9 |
| Example 3 | 3863 | 2421 | 2306 | $K_{20} > K_{30}$ | 58.1 |
| Example 4 | 4906 | 2829 | 2016 | $K_{20} > K_{30}$ | 61.6 |
| Example 5 | 5216 | 2989 | 2058 | $K_{20} > K_{30}$ | 62.1 |
| Example 6 | 4858 | 2793 | 1983 | $K_{20} > K_{30}$ | 60.1 |
| Example 7 | 5936 | 3741 | 3672 | $K_{20} > K_{30}$ | 57.6 |
| Example 8 | 5464 | 3325 | 3204 | $K_{20} > K_{30}$ | 57.2 |
| Example 9 | 4850 | 3672 | 2852 | $K_{20} > K_{30}$ | 60.3 |
| Example 10 | 4015 | 3529 | 2748 | $K_{20} > K_{30}$ | 60.1 |
| Comparative Example 1 | 3247 | 1922 | 566 | $K_{20} > K_{30}$ | Did not reach |
| Comparative Example 2 | 9196 | 8223 | 8864 | $K_{20} < K_{30}$ | 32.6 |
| Comparative Example 3 | 6255 | 4919 | 5851 | $K_{20} < K_{30}$ | 32.3 |
| Comparative Example 4 | 5697 | 3751 | 4336 | $K_{20} < K_{30}$ | 39.8 |

Conductive Particle Evaluation Test 3

(Single Particle Compression Conductivity Test)

The particles obtained respectively in Examples 1 to 10 and Comparative Examples 1 to 4 were subjected to evaluation of recovery performance and restoring performance by successively repeating a loading-unloading test 10 times so as to give compression displacements of 50%, 55%, and 60% by use of a micro-compression testing machine (MCT-W201, produced by Shimadzu Corporation) (measurement temperature: 20° C.).

The results are given in Table 18.

TABLE 18

| | Compression displacement 50% | Compression displacement 55% | Compression displacement 60% |
|---|---|---|---|
| Example 1 | A | A | A |
| Example 2 | A | A | A |
| Example 3 | A | A | A |
| Example 4 | A | A | A |
| Example 5 | A | A | A |
| Example 6 | A | A | A |
| Example 7 | A | A | D |
| Example 8 | A | A | D |
| Example 9 | B | B | B |
| Example 10 | B | B | B |
| Comparative Example 1 | C | C | C |
| Comparative Example 2 | D | D | D |
| Comparative Example 3 | D | D | D |
| Comparative Example 4 | D | D | D |

A: Both recovery performance and restoring performance were good, without any large change.
B: Both recovery performance and restoring performance tended to be lowered, but elastic force was present (final recovery factor: not less than 20%).
C: Both recovery performance and restoring performance were lowered largely (final recovery factor: not more than 15%).
D: Broken during the process.

Example 11

Anisotropic Conductive Adhesive

An epoxy resin (Epicoat 828, produced by Japan Epoxy Resins Co., Ltd.) and a hardener (Novacure HX3722, produced by Asahi Kasei Chemicals Corporation) in a mixing ratio of 80/20 (by weight) were dissolved in methyl ethyl ketone, and Conductive Particles 1 obtained in Example 1 were added to the solution in an amount of 5 wt % based on the whole solid matter, followed by dispersing by a known dispersing machine, to obtain a dispersion containing conductive particles for forming a film. Next, by use of a bar coater, the dispersion was subjected to flow casting and drying, to obtain an anisotropic conductive film adhesive having a thickness of about 20 μm.

By use of the anisotropic conductive film adhesive, flexible printed circuit boards (FPC) each having a copper circuit with a line width of 50 μm, a pitch of 100 μm and a thickness of 35 μm were subjected to aligning of the circuits and to connection of the circuits to each other by heating and pressing at 170° C. and 10 kgf/cm² for 30 seconds. The connection resistance between the pair of FPCs was measured at a measurement current of 1 A, to be not more than 2.5 O. Fifty (50) such flexible printed circuit boards were produced on a prototype basis, and served similarly to measurement of connection resistance, whereby the conductive particles were confirmed to be excellent in connection reliability, attended by no special problems.

Comparative Example 5

In the same manner as in Example 11 except for using Conductive Particles 12 obtained in Comparative Example 2, an anisotropic conductive film adhesive was obtained.

By use of the anisotropic conductive film adhesive, flexible printed circuit boards were produced, and served to measurement of connection resistance, in the same manner as in Example 11. Some dispersion of connection resistance was observed among the flexible printed circuit boards; thus, the conductive particles were found to be poor in yield and connection reliability.

Japanese Patent Application No. 2006-269028 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. Conductive particles each comprising a polymer base particle and a conductive layer coating said polymer base particle,
given the compressive elastic deformation characteristic $K_X$ of one of the conductive particles when the displacement of particle diameter of said conductive particles is X % is defined by the following formula [1]:

$$K_X=(3/\sqrt{2}) \cdot (S_X^{-3/2}) \cdot (R^{-1/2}) \cdot F_X \qquad [1]$$

where $F_X$ is the load (N) necessary for X % displacement of said conductive particles, $S_X$ is the compressive deformation amount (mm) upon X % displacement of said conductive particles, and R is the particle radius (mm) of said conductive particles,
the compressive elastic deformation characteristic $K_{50}$ is 100 to 50000 N/mm² at 20° C. when the displacement of particle diameter of said conductive particles is 50%, and
the recovery factor of particle diameter of said conductive particles when the displacement of particle diameter of said conductive particles is 50% is not less than 30% at 20° C.,
wherein said polymer base particles each comprise a core particle and a polymer coat layer formed on the surface of said core particle, and said polymer coat layer is made of a hydrophobic resin,
wherein said core particles are obtained by polymerization of at least one monomer having at least two unsaturated double bonds in its molecule, in an amount of not less than 35 wt %; and
wherein said monomer having at least two unsaturated double bonds comprises divinylbenzene and $C_6$-$C_{18}$ alkanediol di(meth)acrylate monomers.

2. The conductive particles as set forth in claim 1, wherein in a compression displacement range of not more than 55%, there is no breaking point or no point of inflection when the compressive deformation factor increases abruptly.

3. The conductive particles as set forth in claim 1, wherein in a graph showing the relationship between compressive elastic deformation characteristic $K_X$ of said conductive particles and compression displacement at 20° C., with said compressive elastic deformation characteristic $K_X$ taken on the axis of ordinates and with said compression displacement taken on the axis of abscissa,
in the case where the point of compressive elastic deformation characteristic $K_{10}$ upon 10% displacement of particle diameter of said conductive particles is taken as a reference point, a straight line passing through said reference point and being orthogonal to said axis of ordinates is drawn, and the other intersection of said straight line with said graph than said reference point is made to be $K_P$ point, the compression displacement at said $K_P$ point is not less than 40%.

4. The conductive particles as set forth in claim 1, given the compressive elastic deformation characteristic $K_{BX}$ of one of the polymer base particle when the displacement of particle diameter of said polymer base particles is X % is defined by the following formula [2]:

$$K_{BX}=(3/\sqrt{2}) \cdot (S_{BX}^{-3/2}) \cdot (R_B^{-1/2}) \cdot F_{BX} \qquad [2]$$

where $F_{BX}$ is the load (N) necessary for X % displacement of said polymer base particles, $S_{BX}$ is the compressive deformation amount (mm) upon X % displacement of said polymer base particles, and $R_B$ is the particle radius (mm) of said polymer base particles,
the compressive elastic deformation characteristic $K_{B60}$ is 100 to 50000 N/mm² at 20° C. when the displacement of particle diameter of said polymer base particles is 60%, and
the recovery factor of particle diameter of said polymer base particles when the displacement of particle diameter of said polymer base particles is 60% is not less than 20% at 20° C.

5. The conductive particles as set forth in claim 1, wherein the compressive elastic deformation characteristic $K_{C10}$ of one particle upon 10% displacement of particle diameter of said core particles and the compressive elastic deformation characteristic $K_{B10}$ of one particle upon 10% displacement of particle diameter of said polymer base particles satisfies the following expression [3]:

$$K_{C10} > K_{B10} \qquad [3].$$

6. The conductive particles as set forth in claim 1, wherein said hydrophobic resin is a styrene resin.

7. The conductive particles as set forth in claim 1, wherein said monomer having at least two unsaturated double bonds comprises divinylbenzene and $C_8$-$C_{12}$ alkanediol di(meth)acrylate monomers.

8. The conductive particles as set forth in claim 1, wherein said core particles are obtained by further polymerization of an unsaturated monomer having a hydrophilic functional group or active hydrogen group in its molecule, in an amount of not less than 3 wt %, in addition to said monomer having at least two unsaturated double bonds in its molecule.

9. The conductive particles as set forth in claim 8, wherein said unsaturated monomer having said hydrophilic functional group or active hydrogen group is a monomer having at least one functional group selected from among hydroxyl group, carboxyl group, amino group, amide group and alkylene oxide groups.

10. The conductive particles as set forth in claim 1, wherein said core particles are prepared by solution polymerization of a starting monomer containing not less than 35 wt % of at least one monomer which has at least two unsaturated double bonds in the molecule thereof and which includes divinylbenzene and $C_6$-$C_{18}$ alkanediol di(meth)acrylate monomers, in a medium which dissolves said starting monomer but does not dissolve the particles produced.

11. A method of preparing conductive particles, comprising the steps of subjecting a starting monomer containing not less than 35 wt % of a monomer or monomers which has at least two unsaturated double bonds in the molecule thereof and which includes divinylbenzene and $C_6$-$C_{18}$ alkanediol di(meth)acrylate monomers to solution polymerization in a medium which dissolves said starting monomer but does not dissolve the particles produced, so as to prepare core particles, forming a polymer coat layer on the surface of each of said core particles, so as to prepare polymer base particles, and forming a conductive layer on the surface of each of said polymer base particles.

12. A resin composition comprising the conductive particles as set forth in claim 1, and a resin.

13. A conductive adhesive comprising the conductive particles as set forth in claim 1, and an adhesive resin.

14. The conductive particles as set forth in claim 7, wherein said core particles are obtained by further using an unsaturated monomer having a hydrophilic functional group or active hydrogen group in its molecule, in an amount of not less than 3 wt %, in addition to said monomer having at least two unsaturated double bonds in its molecule.

* * * * *

UNITED STATES PATENT AND TRADEMARK OFFICE
CERTIFICATE OF CORRECTION

PATENT NO.         : 9,093,196 B2
APPLICATION NO.    : 11/863379
DATED              : July 28, 2015
INVENTOR(S)        : Toshifumi Hashiba et al.

It is certified that error appears in the above-identified patent and that said Letters Patent is hereby corrected as shown below:

Title Page

Please change the Assignee information indicated below:

"(73) Assignee: NISSHINBO HOLDINGS, INC., Tokyo, (JP)"

To read as:

--(73) Assignee: NIPPON CHEMICAL INDUSTRIAL CO., LTD., Tokyo, (JP)--

Signed and Sealed this
Twenty-sixth Day of July, 2016

Michelle K. Lee
*Director of the United States Patent and Trademark Office*